(12) United States Patent
Vellianitis et al.

(10) Patent No.: US 12,324,360 B2
(45) Date of Patent: Jun. 3, 2025

(54) SEMICONDUCTOR STRUCTURE AND METHOD OF FORMING THE SAME

(71) Applicant: Taiwan Semiconductor Manufacturing Company, Ltd., Hsinchu (TW)

(72) Inventors: Georgios Vellianitis, Heverlee (BE); Gerben Doornbos, Kessel-Lo (BE); Marcus Johannes Henricus Van Dal, Linden (BE); Mauricio Manfrini, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 4 days.

(21) Appl. No.: 18/356,168

(22) Filed: Jul. 20, 2023

(65) Prior Publication Data

US 2023/0363291 A1    Nov. 9, 2023

Related U.S. Application Data

(63) Continuation of application No. 16/933,914, filed on Jul. 20, 2020, now Pat. No. 11,751,487.

(51) Int. Cl.
| | |
|---|---|
| *H10N 52/80* | (2023.01) |
| *H10B 61/00* | (2023.01) |
| *H10N 50/85* | (2023.01) |
| *H10N 52/00* | (2023.01) |
| *H10N 52/01* | (2023.01) |

(52) U.S. Cl.
CPC ............ *H10N 52/80* (2023.02); *H10B 61/10* (2023.02); *H10N 50/85* (2023.02); *H10N 52/01* (2023.02); *H10N 52/101* (2023.02)

(58) Field of Classification Search
CPC ........ H01L 43/14; H01L 27/224; H10N 52/80
See application file for complete search history.

(56) References Cited

U.S. PATENT DOCUMENTS

| | | | |
|---|---|---|---|
| 2015/0060991 A1* | 3/2015 | Mizutani | H01L 29/513 438/287 |
| 2019/0123263 A1* | 4/2019 | Park | H10N 50/01 |
| 2021/0287727 A1* | 9/2021 | Tsubata | G11C 11/161 |
| 2021/0288243 A1* | 9/2021 | Ochiai | H10N 50/85 |
| 2021/0313393 A1* | 10/2021 | Wei | H10N 70/841 |

* cited by examiner

*Primary Examiner* — Moazzam Hossain
*Assistant Examiner* — Hajar Kolahdouzan
(74) *Attorney, Agent, or Firm* — JCIPRNET

(57) ABSTRACT

A semiconductor structure includes a storage element layer and a selector. The selector is electrically coupled to the storage element layer, and includes a first insulating layer, a second insulating layer, a third insulating layer, a first conductive layer and a second conductive layer. The first insulating layer, the second insulating layer and the third insulating layer are stacked up in sequence, wherein the second insulating layer is sandwiched in between the first insulating layer and the third insulating layer, and the first insulating layer and the third insulating layer include materials with higher band gap as compared with a material of the second insulating layer. The first conductive layer is connected to the first insulting layer, and the second conductive layer is connected to the third insulating layer.

20 Claims, 20 Drawing Sheets

SEMICONDUCTOR STRUCTURE AND METHOD OF FORMING THE SAME

CROSS-REFERENCE TO RELATED APPLICATION

This application is a continuation application of and claims the priority benefit of U.S. application Ser. No. 16/933,914, filed on Jul. 20, 2020, now allowed. The entirety of the above-mentioned patent application is hereby incorporated by reference herein and made a part of this specification.

BACKGROUND

A magnetic random access memory (MRAM) offers comparable performance to volatile static random access memory (SRAM) and comparable density with lower power consumption to volatile dynamic random access memory (DRAM). Compared to non-volatile memory flash memory, an MRAM offers much faster access times and suffers minimal degradation over time, whereas a flash memory can only be rewritten a limited number of times. In general, MRAM stores data using storage elements such as magnetic tunnel junction (MTJ), and the MTJ is typically coupled in series with a control device such as a transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
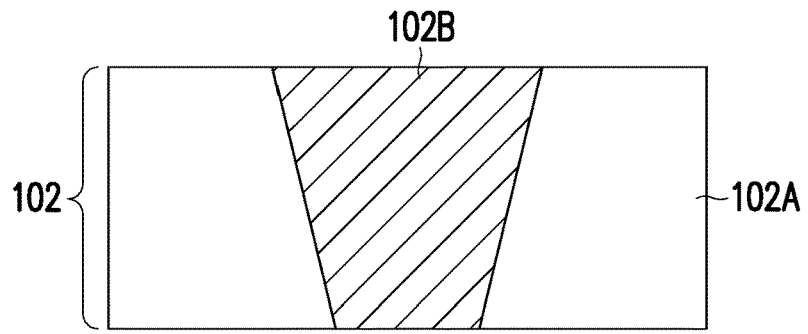
FIG. 1A to FIG. 1E are schematic sectional views of various stages in a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetic random access memory (MRAM) stores data using storage elements such as a magnetic tunnel junction (MTJ). A typical MTJ device used in an MRAM cell includes an MTJ coupled in series with a control device such as a transistor. However, for transistor coupled in series, scaling is compromised given the high current needed to operate an MRAM array. Furthermore, in order to reliably access the memory, the transistor parameters are tuned in such a way to allow sufficient current to flow when the MTJ needs to be selected (transistor on), and not allow current flow when the cell is not selected or half selected (transistor off). However, leakage current (sneak paths) is generally inevitably observed in the non-selected and half selected cells. Therefore, a selector with smaller footprint is needed to replace the access transistor for better area scaling, and is needed for minimizing the leakage current. In the embodiments of present disclosure, a semiconductor device comprising a storage element layer (the MTJ) electrically coupled to a selector is described. The selector enables full control of leakage current, threshold voltage and maximum current density independently, and is optimized for MRAM devices.

FIG. 1A to FIG. 1E are schematic sectional views of various stages in a method of forming a semiconductor device in accordance with some embodiments of the present disclosure. Referring to FIG. 1A, a first interconnection structure 102 is provided. The first interconnection structure 102 may be formed over a substrate (not shown) of a semiconductor device for providing interconnection between elements. The first interconnection structure 102 may include an insulating layer 102A and a conductive via 102B disposed therein. The insulating layer 102A may be formed by any suitable method, such as chemical vapor deposition (CVD), or the like. The conductive via 102B may be formed by patterning the insulting layer 102A to form openings; filling the openings with conductive materials; and performing a planarization step (e.g. chemical-mechanical planarization; CMP) to form the conductive via 102B having a top surface that is levelled with a top surface of the insulating layer 102A.

In some embodiments, the insulating layer 102A is referred to as an inter-metal dielectric (IMD) layer which may be made of a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. In certain embodiments, the conductive via 102B include commonly used conductive materials, such as metals or metal alloys including one or more of Al, AlCu, Cu, Ti, TiN, W, and the like. The first interconnection structure 102 including the insulating layer 102A and the conductive via 102B forms a portion of a current driving circuit (not shown) to provide current to the storage element layer described subsequently.

Figure 1B:
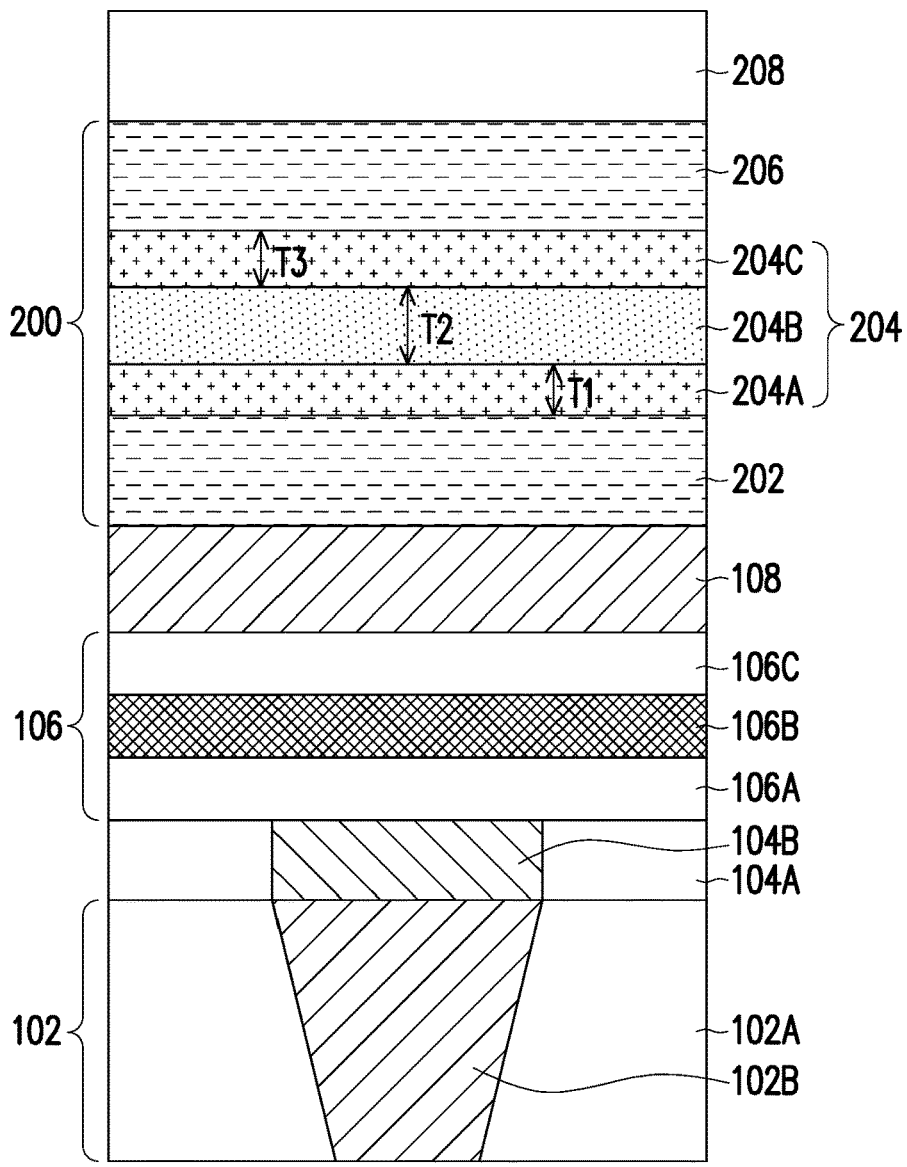

Referring to FIG. 1B, after forming the first interconnection structure 102, an insulating layer 104A and a bottom electrode 104B embedded in the insulating layer 104A are formed over the first interconnection structure 102. For example, the bottom electrode 104B is formed to be in contact with the conductive via 102B of the first interconnection structure 102. A material of the insulating layer 104A may be similar to the insulating layer 102A shown in FIG. 1A. For example, the insulating layer 104A is made of a dielectric material, such as silicon oxide, silicon nitride, silicon oxynitride, a spin-on dielectric material, a low-k dielectric material, or the like. In some embodiments, the bottom electrode 104B is made of conductive materials, such as Ti, Ta, TaN, Co, Cu, AlCu, W, TiN, TiW, TiAl, TiAlN, Pt, Ru, $RuO_x$, Mo, $MoO_x$ or a combination thereof. The bottom electrode 104B may be formed by any suitable method, such as chemical vapor deposition (CVD), physical vapor deposition (PVD), or the like.

After forming the insulting layer 104A and the bottom electrode 104B, a storage element layer 106, a top electrode 108, a selector 200 and a hard mask layer 208 are sequentially disposed on the bottom electrode 104B. In some embodiments, the storage element layer 106 is formed on the bottom electrode 104B to be in contact with the bottom electrode 104B. In certain embodiments, the storage element layer 106 is referred to as a magnetic tunnel junction (MTJ). The formation of the storage element layer 106 (or the MTJ) includes sequentially forming a reference layer 106A, a tunnel barrier layer 106B and a free layer 106C over the bottom electrode 104B.

In some embodiments, the reference layer 106A and the free layer 106C include one or more ferromagnetic materials that can be magnetically oriented, respectively. For example, in one embodiment, a magnetic orientation of the reference layer 106A is static (i.e., fixed), while a magnetic orientation of the free layer 106C is capable of switching between a parallel configuration and an anti-parallel configuration with respect to that of the reference layer 106A. The parallel configuration provides for a low resistance state that digitally stores data as a first data state (e.g., a logical "0"). The anti-parallel configuration provides for a high resistance state that digitally stores data as a second data state (e.g., a logical "1"). In some embodiments, the tunnel barrier layer 106B is made of a non-magnetic material and is disposed between the reference layer 106A and the free layer 106C. In certain embodiments, the tunnel barrier layer 106B includes a relatively thin oxide layer capable of electrically isolating the free layer 106C from the reference layer 106A at low potentials and capable of conducting current through electron tunneling at higher potentials. In one embodiment, the tunnel barrier layer 106B is made of magnesium oxide (MgO).

As illustrated in FIG. 1B, the top electrode 108 is formed on the storage element layer 106. For example, the top electrode 108 is formed on and in contact with the free layer 106C of the storage element layer 106, while the storage element layer 106 is disposed in between the top electrode 108 and the bottom electrode 104B. In some embodiments, the top electrode 108 includes a conductive material, such as Ti, Ta, TaN, Co, Cu, AlCu, W, TiN, TiW, TiAl, TiAlN, Pt, Ru, $RuO_x$, Mo, $MoO_x$ or a combination thereof. The top electrode 108 and the bottom electrode 104B may include the same material or different materials. For example, in one embodiment, the top electrode 108 and the bottom electrode 104B are both made of TiN. The top electrode 108 may be formed by any suitable method, such as chemical vapor deposition (CVD), physical vapor deposition (PVD), or the like.

After forming the top electrode 108, the selector 200 is formed over the top electrode 108 to be connected to the top electrode 108. In some embodiments, the selector 200 is electrically connected to the storage element layer 106 through the top electrode 108. In some embodiments, the selector 200 is formed by sequentially forming a first conductive layer 202, insulating layers 204 and a second conductive layer 206 over the top electrode 108. The first conductive layer 202 and the second conductive layer 206 are made of metals having a work function of 3.8 eV to 4.6 eV. For example, the first conductive layer 202 and the second conductive layer 206 may include materials such as Al, Ti, TiN, TiW, TiAl, Ta, Hf, W, WN, Mo, Zr, Mg, V, Nb or the like. The first conductive layer 202 and the second conductive layer 206 may be formed by any suitable method, such as chemical vapor deposition (CVD), atomic layer deposition (ALD), physical vapor deposition (PVD), or the like. Furthermore, the first conductive layer 202 and the second conductive layer 206 may include the same materials or include different materials.

As illustrated in FIG. 1B, the insulating layers 204 are formed between the first conductive layer 202 and the second conductive layer 206. The formation of the insulating layers 204 includes sequentially forming a first insulating layer 204A, a second insulating layer 204B and a third insulating layer 204C stacked over the first conductive layer 202. The insulating layers 204 may be formed by any suitable method, such as chemical vapor deposition (CVD), physical vapor deposition (PVD), or the like. In some embodiments, the first insulating layer 204A is connected to and in contact with the first conductive layer 202. In some embodiments, the second insulating layer 204B is sandwiched in between the first insulating layer 204A and the third insulating layer 204C. In certain embodiments, the third insulating layer 204C is connected to and in contact with the second conductive layer 206.

In the exemplary embodiment, the first insulating layer 204A and the third insulating layer 204C include materials with higher band gap as compared with a material of the second insulating layer 204B. In other words, a low band gap material layer (the second insulating layer 204B) is disposed in between two high band gap material layers (the first insulting layer 204A and the third insulating layer 204C). In some embodiments, the first insulting layer 204A and the third insulating layer 204C (the high band gap materials) include materials selected from the group consisting of silicon nitride (SiN), silicon oxide ($SiO_2$), aluminum oxide ($Al_2O_3$), yttrium oxide ($Y_2O_3$) and hafnium silicate ($HfSiO_x$). Furthermore, the second insulating layer 204B (the low band gap materials) includes a material selected from the group consisting of titanium oxide ($TiO_2$), strontium titanate ($SrTiO_3$), barium titanate ($BaTiO_3$), zirconium oxide ($ZrO_2$), hafnium oxide ($HfO_2$) and hafnium titanate ($HfTiO_x$). In one embodiment, the first insulting layer 204A and the third insulating layer 204C include the same high band gap materials, but the disclosure is not limited thereto. In an alternative embodiment, the first insulting layer 204A and the third insulating layer 204C include different high band gap materials.

Furthermore, in some embodiments, a thickness T1 of the first insulating layer 204A and a thickness T3 of the third insulating layer 204C is smaller than or equal to a thickness T2 of the second insulating layer 204B. The thickness T1 being substantially equal to the thickness T3. In one embodiment, the thickness (T1, T3) of each of the first insulting layer 204A and the third insulating layer 204C relative to the thickness T2 of the second insulating layer 204B is 1:1 to 1:50. In certain embodiments, the thickness (T1 and T3) of each of the first insulting layer 204A and the third insulating layer 204C relative to the thickness T2 of the second insulating layer 204B is 1:2 to 1:40. In some embodiments, the thickness (T1 and T3) of each of the first insulting layer 204A and the third insulating layer 204C is in a range of 0.1 nm to 1 nm. In some embodiments, the thickness T2 of the second insulating layer 204B is in a range of 1 nm to 5 nm. In some embodiments, the thickness (T1 and T3) of each of the first insulting layer 204A and the third insulating layer 204C is controlled in the above range so that the tunneling current is high enough to be able to switch the storage element layer 106 (the MTJ). In some embodiments, the thickness T2 of the second insulating layer 204B defines at which voltage the current will start to increase rapidly to enhance the performance of the selector 200.

In some embodiments, the first conductive layer 202, the insulating layers 204 (three insulating layers 204A-204C) and the second conductive layer 206 of the selector 200 are respectively Al, $Al_2O_3$, $SrTiO_3$, $Al2O_3$ and Al. In some alternative embodiments, the first conductive layer 202, the insulating layers 204 (three insulating layers 204A-204C) and the second conductive layer 206 of the selector 200 are respectively TiN, $Al_2O_3$, $SrTiO_3$, $Al_2O_3$ and TiN.

In the exemplary embodiment, by using a selector 200 including the first conductive layer 202 and the second conductive layer 206 having the selected work function, and including the insulating layers 204 having the low and high band gap materials, better control of the on/off current of the selector 200 may be achieved. For example, in some embodiments, when an applied voltage is smaller than a difference between a work function of the conductive layers (202, 206) and an electron affinity of the second insulating layer 204B (low applied voltage), the current flow is low because electrons sees the energy barrier of all the three insulating layers (204A-204C) (controls the "off" current). In some embodiments, when the applied voltage is greater than a difference between a work function of the conductive layers (202, 206) and an electron affinity of the second insulating layer 204B, but smaller than a difference between a work function of the conductive layers (202, 206) and an electron affinity of the first or third insulating layer 204A or 204C (high applied voltage), then the electrons see the barriers of the outer insulating layers (204A, 204C), and the current flow increases rapidly and the electrons tunnels through the three insulating layers (204A-204C) (controls the "on" current; corresponding to the threshold voltage). Furthermore, since the applied voltage is greater than a difference between a work function of the conductive layers (202, 206) and an electron affinity of the second insulating layer 204B, this further increases the current flow and the electrons tunnels through a triangular barrier by Fowler-Nordheim tunneling through the second insulating layer 204B. In some embodiments, when the applied voltage is higher than the difference between a work function of the conductive layers (202, 206) and an electron affinity of the first or third insulating layer 204A or 204C, then the current flow is high. As such, a selector 200 having relatively high resistance to current flow at low bias and very high current flow at high bias can be achieved. Furthermore, the selector 200 enables full control of the leakage current as the current passing through a selected cell exceeds the residual leakage.

Referring to FIG. 1B, after forming the selector 200, a hard mask layer 208 is formed over the selector 200. For example, the hard mask layer 208 is formed on and in contact with the second conductive layer 206 of the selector 200. In some embodiments, the hard mask layer 208 is a metal hard mask made of materials such as TiN, TaN, or the like. However, the disclosure is not limited thereto. In some alternative embodiments, the hard mask layer 208 is an inorganic dielectric material, such as SiON, SiN, SiC, SiOC, SiCN, or a combination thereof. The hard mask layer 208 may be formed by any suitable method, such as chemical vapor deposition (CVD), physical vapor deposition (PVD), or the like. At this stage, the hard mask layer 208 has sidewalls that are aligned with the selector 200, the top electrode 108, the storage element layer 106 and the insulating layer 104A.

Figure 1C:
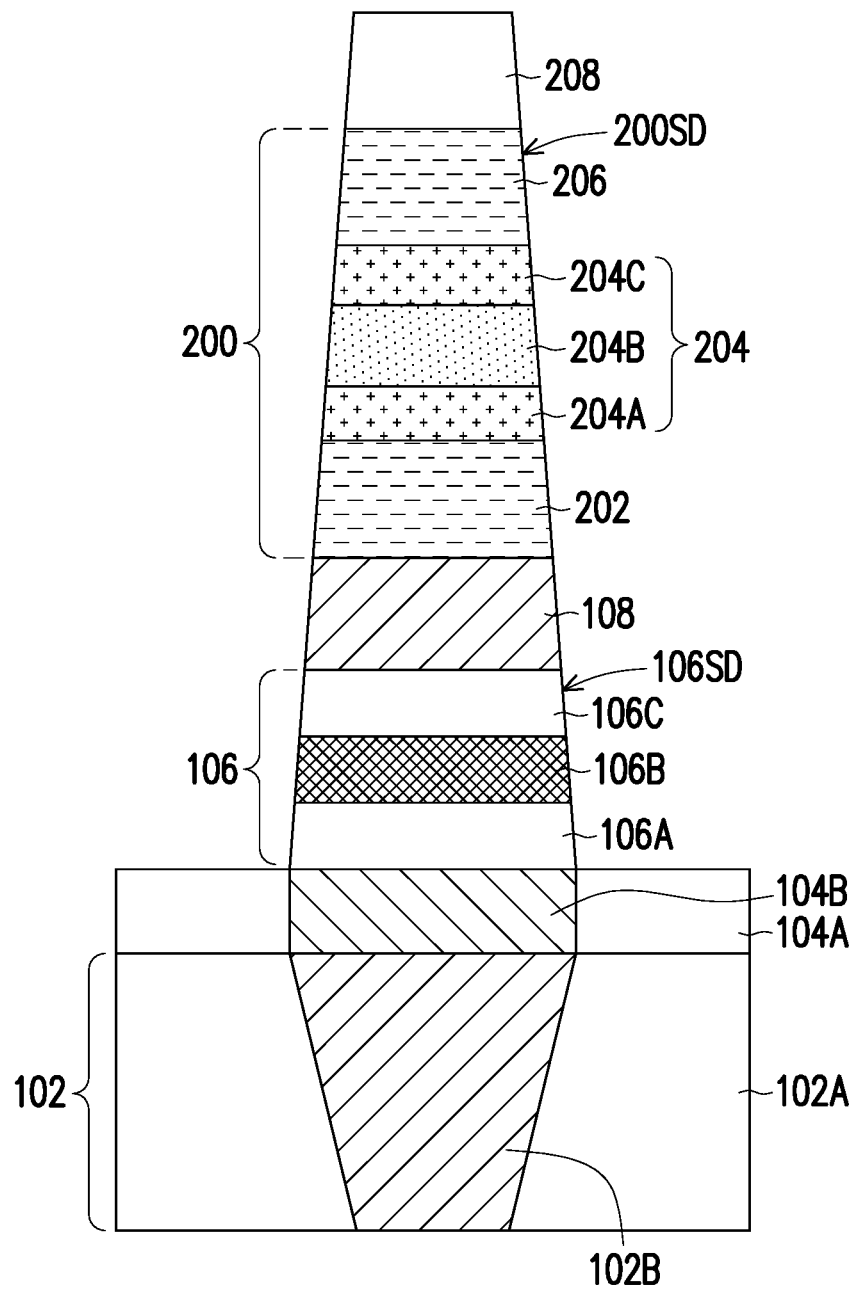

Referring to FIG. 1C, in a next step, the storage element layer 106, the top electrode 108, the selector 200 and the hard mask layer 208 are selectively etched to form a stacked structure having inclined sidewalls. For example, the selective etching process includes a reactive ion etching (RIE) process, an ion beam etching (IBE) process, or combinations thereof. In some embodiments, after the selective etching process, the inclined sidewalls 200SD of the selector 200 are aligned with the inclined sidewalls 106SD of the storage element layer 106.

Figure 1D:
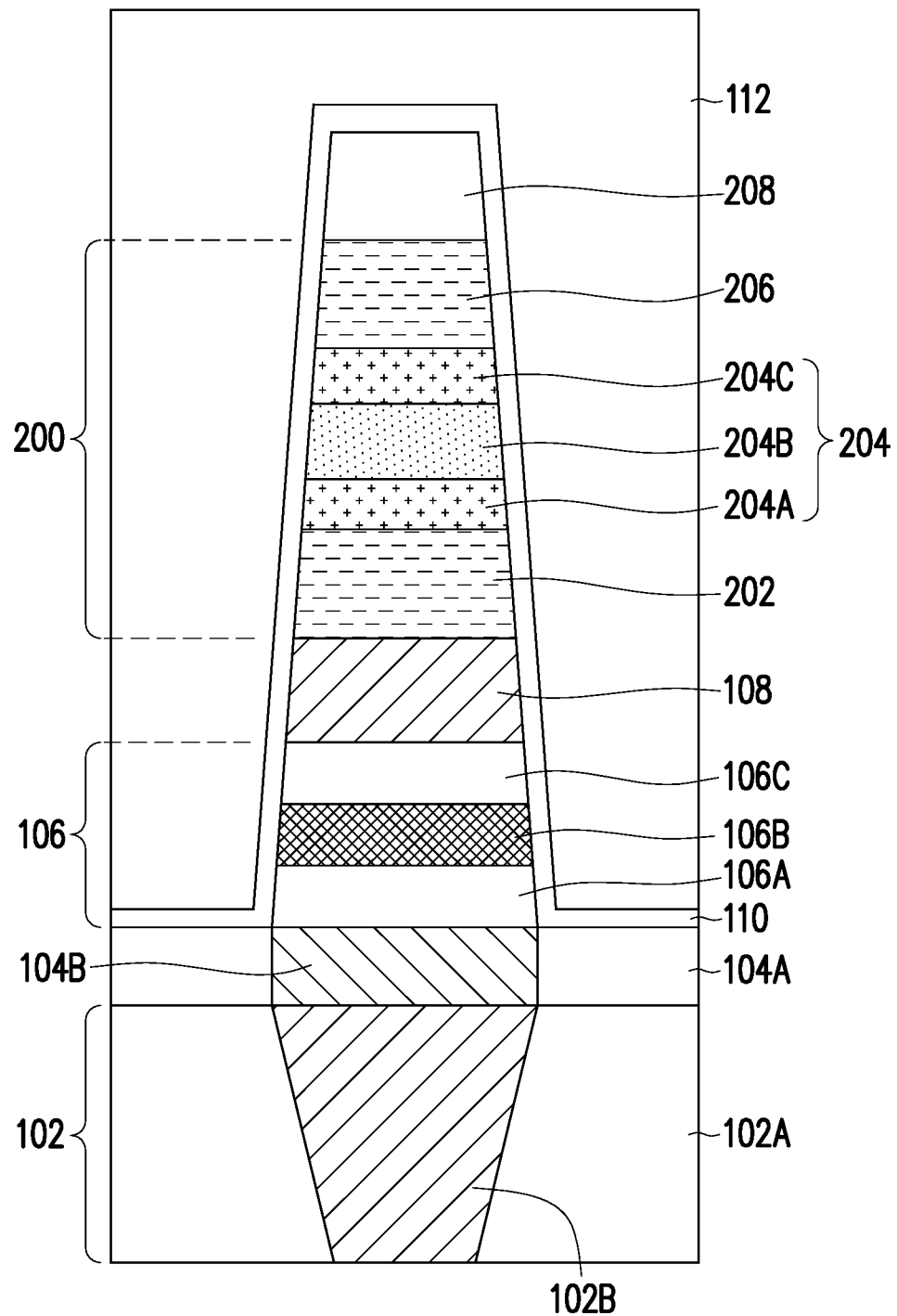

Referring to FIG. 1D, after performing the selective etching process, a liner layer 110 is conformally formed over the insulating layer 104A and over the hard mask layer 208. For example, the liner layer 110 covers the inclined sidewalls 200SD of the selector 200 and covers the inclined sidewalls 106SD of the storage element layer 106. In some embodiments, the liner layer 110 includes a dielectric material such as silicon oxide, silicon nitride, and/or other suitable dielectric materials. Furthermore, the liner layer 108 may be formed by a suitable process such as atomic layer deposition (ALD), chemical vapor deposition (CVD), physical vapor deposition (PVD), or the like.

As illustrated in FIG. 1D, after forming the liner layer 110, a passivation layer 112 surrounding the liner layer 110 is formed. In some embodiments, the passivation layer 112 is formed on the liner layer 110 and over the insulating layer 104A. In certain embodiments, the passivation layer 112 surrounds the storage element layer 106, the top electrode 108, the selector 200 and the hard mask layer 208. In some embodiments, the passivation layer 112 is referred to as an inter-metal dielectric (IMD) layer which includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. Furthermore, the passivation layer 112 may be formed by any suitable method, such as chemical vapor deposition (CVD), or the like.

Figure 1E:
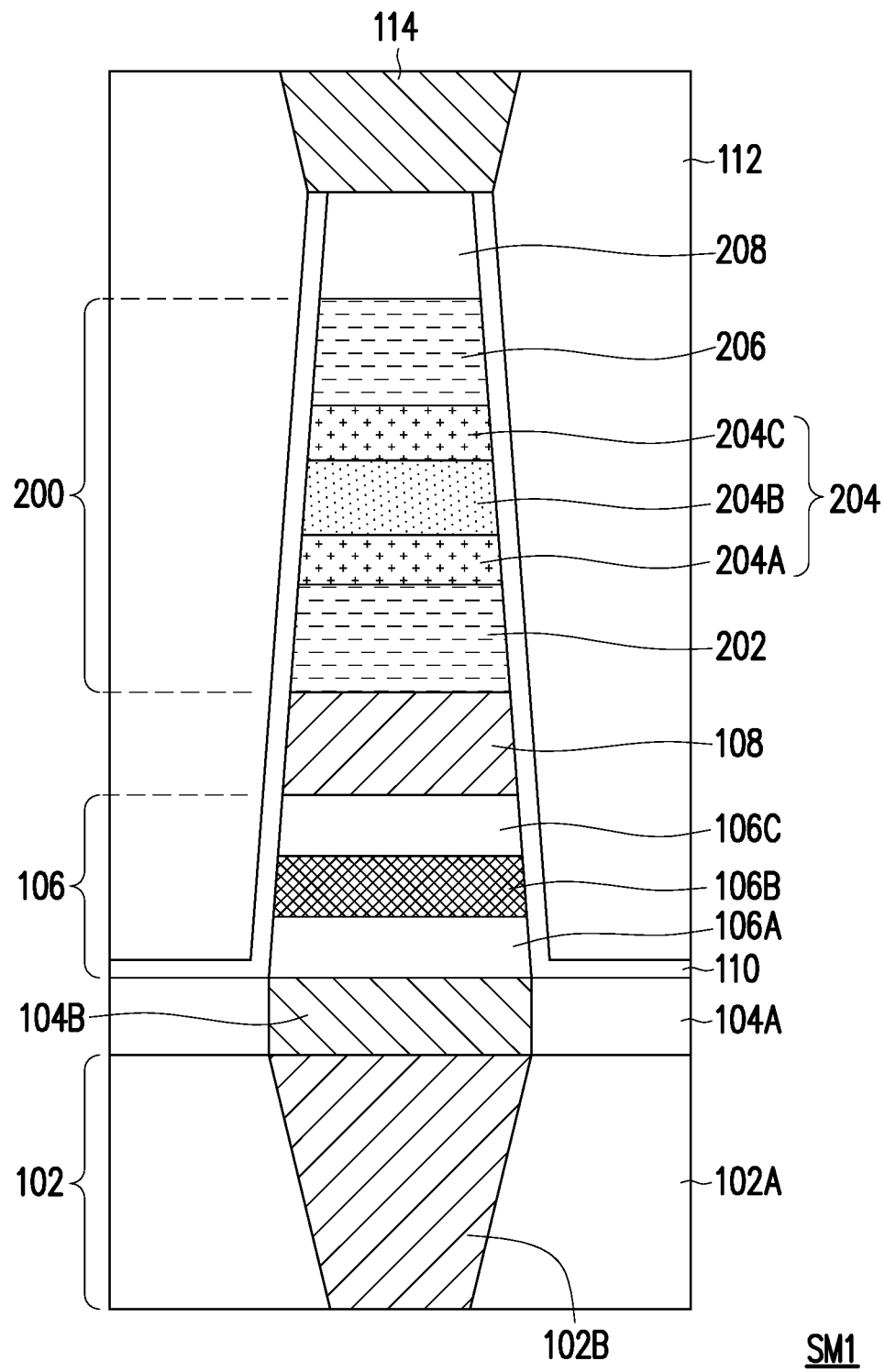

Referring to FIG. 1E, in a next step, portions of the passivation layer 112 and portions of the liner layer 112 are removed to form an opening (not shown) revealing a surface of the hard mask layer 208 (metal hard mask). For example, the passivation layer 112 and the liner layer 112 may be removed by etching processes, or other suitable processes. Thereafter, a second interconnection structure 114 is formed in the opening over the hard mask layer 208, and the second interconnection structure 114 is electrically connected to the selector 200 through the hard mask layer 208. In some embodiments, the second interconnection structure 114 is formed by filling a conductive material in the opening of the passivation layer 112, then performing a planarization process (e.g. a chemical-mechanical planarization (CMP) process) to remove excess conductive material. In some embodiments, the second interconnection structure 114 include metals or metal alloys such as one or more of Al, AlCu, Cu, Ti, TiN, W, or the like. After forming the second interconnection structure 114, a semiconductor device SM1 according to some embodiments of the present disclosure is accomplished.

As illustrated in FIG. 1E, the semiconductor device SM1 includes a storage element layer 106 and a selector 200 electrically coupled to the storage element layer 106. For example, the selector 200 is electrically connected to the storage element layer 106 through the top electrode 108. In some embodiments, the first interconnection structure 102 is electrically connected to the storage element layer 106 (the MTJ) through the bottom electrode 104B. In certain embodiments, the second interconnection structure 114 is electrically connected to the selector 200 through the hard mask layer 208 (metal hard mask). In some alternative embodiments, the hard mask layer 208 may be optionally removed, and the second interconnection structure 114 is electrically connected and in contact with the second conductive layer 206 of the selector 200. In the semiconductor device SM1, by using the selector 200 electrically coupled (in series) to the storage element layer 106 (the MTJ), a device that enables full control of leakage current, threshold voltage and maximum current density independently can be achieved.

FIG. 2A to FIG. 2D are schematic sectional views of various stages in a method of forming a semiconductor device in accordance with some other embodiments of the present disclosure. The method illustrated in FIG. 2A to FIG. 2D is similar to the method illustrated in FIG. 1A to FIG. 1E. Therefore, the same reference numerals are used to refer to the same or liked parts, and its detailed description will be omitted herein.

In the method of FIG. 1A to FIG. 1E, the storage element layer 106 is formed prior to forming the selector 200, and the selector 200 is formed over the top electrode 108 so that the first conductive layer 202 of the selector 200 is connected to the top electrode 108. However, the disclosure is not limited thereto, and in the method of FIG. 2A to FIG. 2D, the storage element layer 106 is formed after forming the selector 200.

Figure 2A:
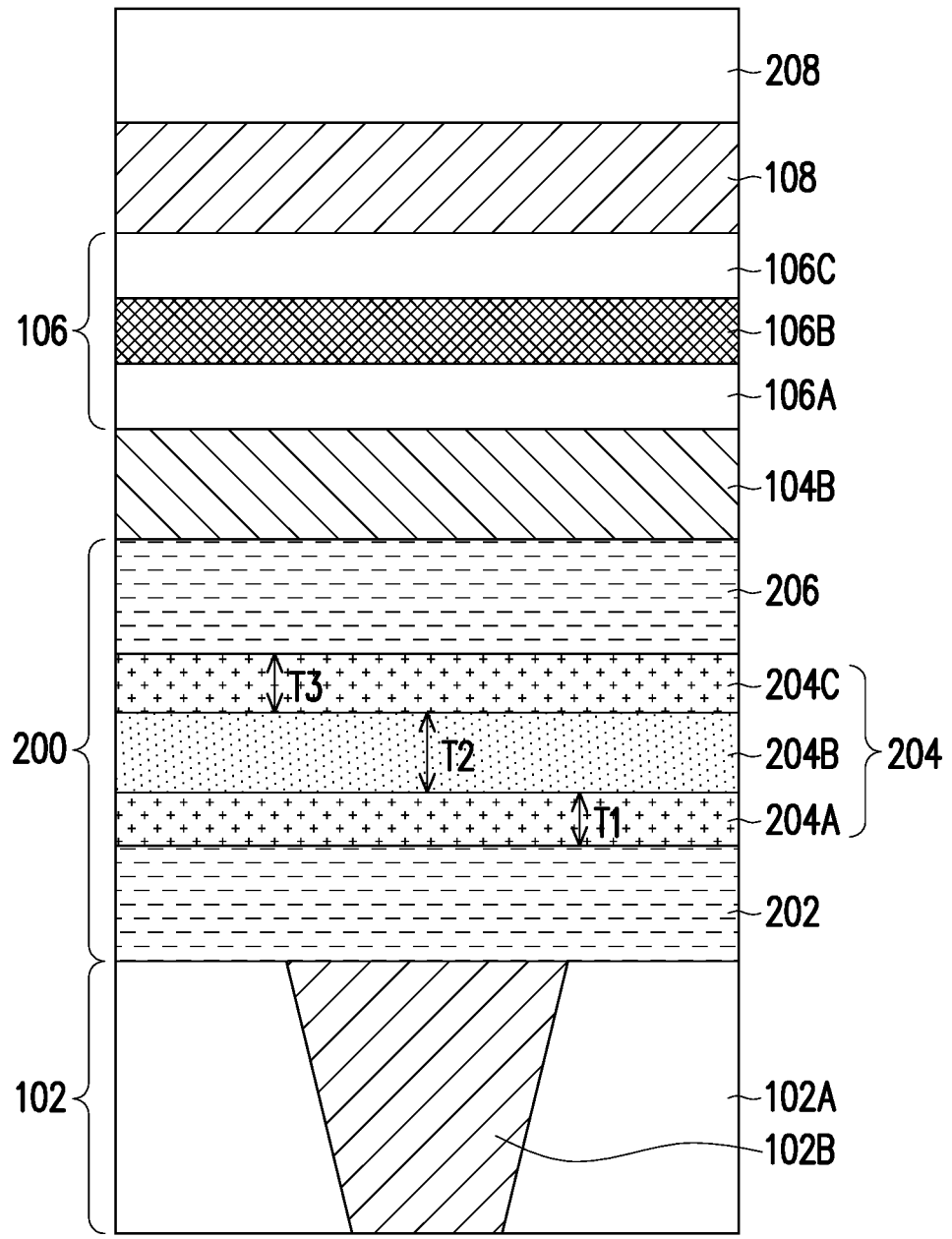
FIG. 2A to FIG. 2D are schematic sectional views of various stages in a method of forming a semiconductor device in accordance with some other embodiments of the present disclosure.

Referring to FIG. 2A, in some embodiments, the selector 200 is formed over the first interconnection structure 102 and connected to the first interconnection structure 102. For example, the selector 200 is formed by sequentially forming a first conductive layer 202, insulating layers 204 (a first insulating layer 204A, a second insulating layer 204B and a third insulating layer 204C) and a second conductive layer 206 stacked up in sequence. The first conductive layer 202 of the selector is electrically and physically connected to the conductive via 102B of the first interconnection structure 102.

After forming the selector 200, a bottom electrode 104B is formed over the selector 200, wherein the bottom electrode 104B is electrically and physically connected to the second conductive layer 206 of the selector 200. Subsequently, a storage element layer 106 (the MTJ) inclusive of a reference layer 106A, a tunnel barrier layer 106B and a free layer 106C is formed over the bottom electrode 104B. For example, the reference layer 106A is disposed on and connected to the bottom electrode 104B. Thereafter, a top electrode 108 and a hard mask layer 208 are sequentially formed over the storage element layer 106 (the MTJ).

Figure 2B:
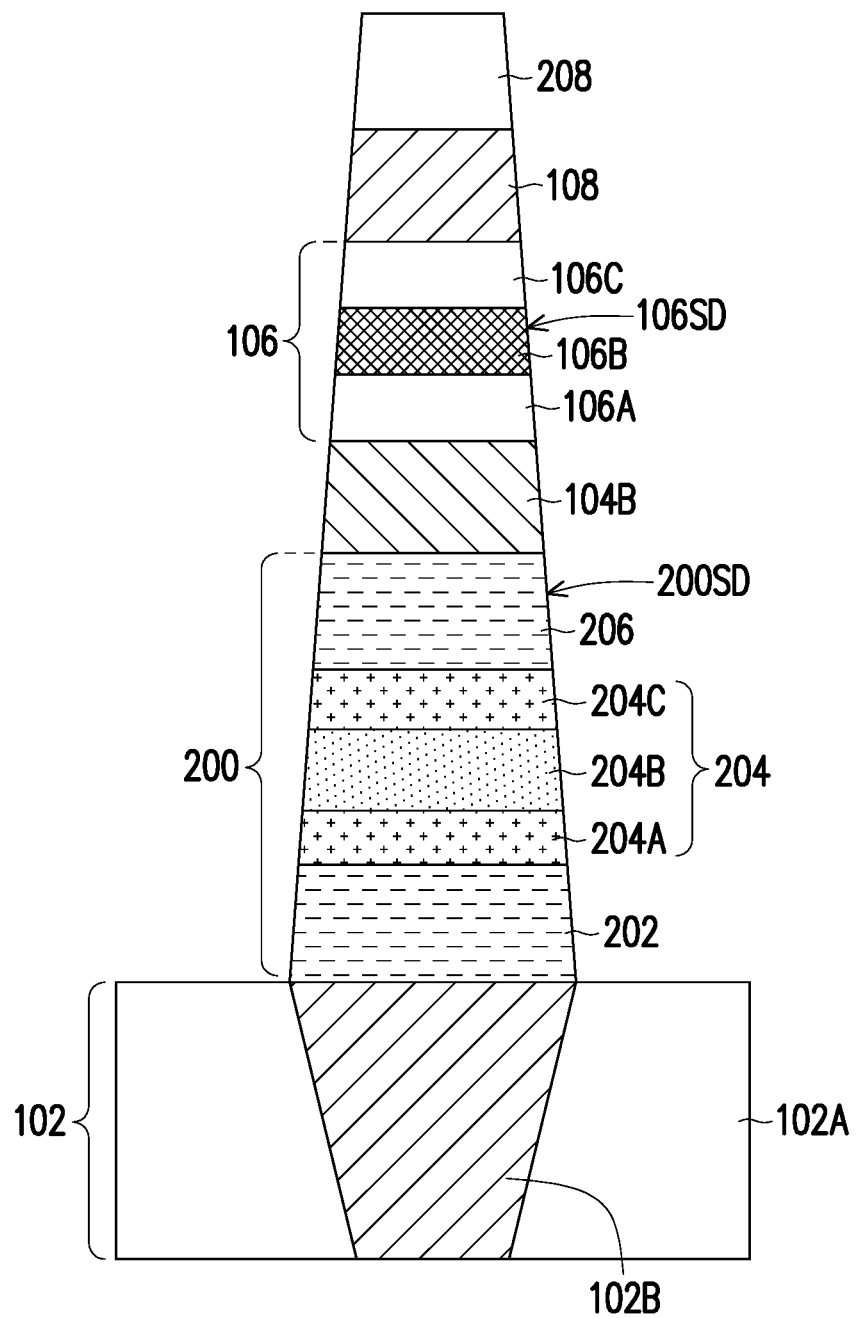

Referring to FIG. 2B, in a next step, the selector 200, the bottom electrode 104B, the storage element layer 106, the top electrode 108, and the hard mask layer 208 are selectively etched to form a stacked structure having inclined sidewalls. For example, the selective etching process includes a reactive ion etching (RIE) process, an ion beam etching (IBE) process, or combinations thereof. In some embodiments, after the selective etching process, the inclined sidewalls 200SD of the selector 200 are aligned with the inclined sidewalls 106SD of the storage element layer 106.

Figure 2C:
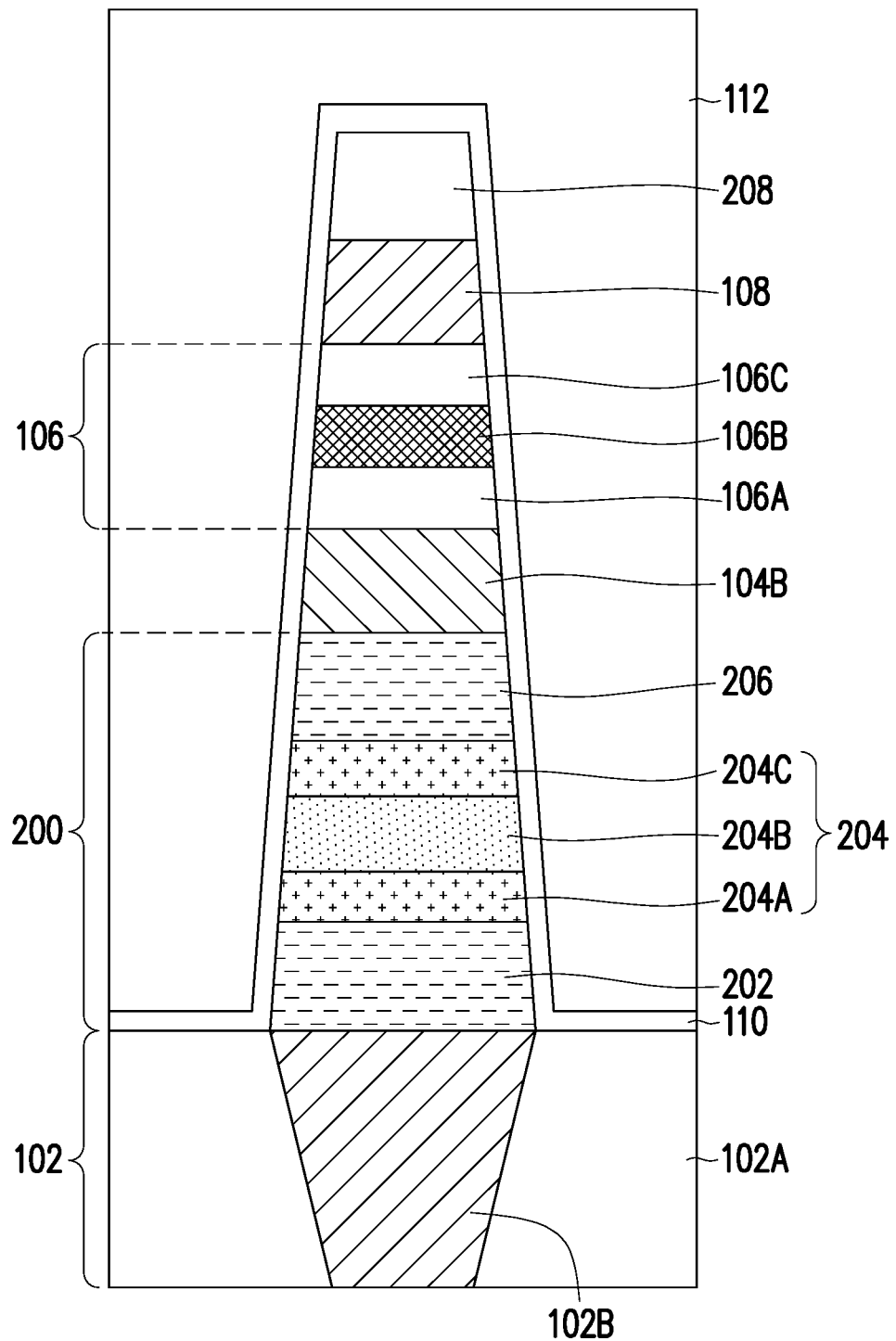
Figure 2D:
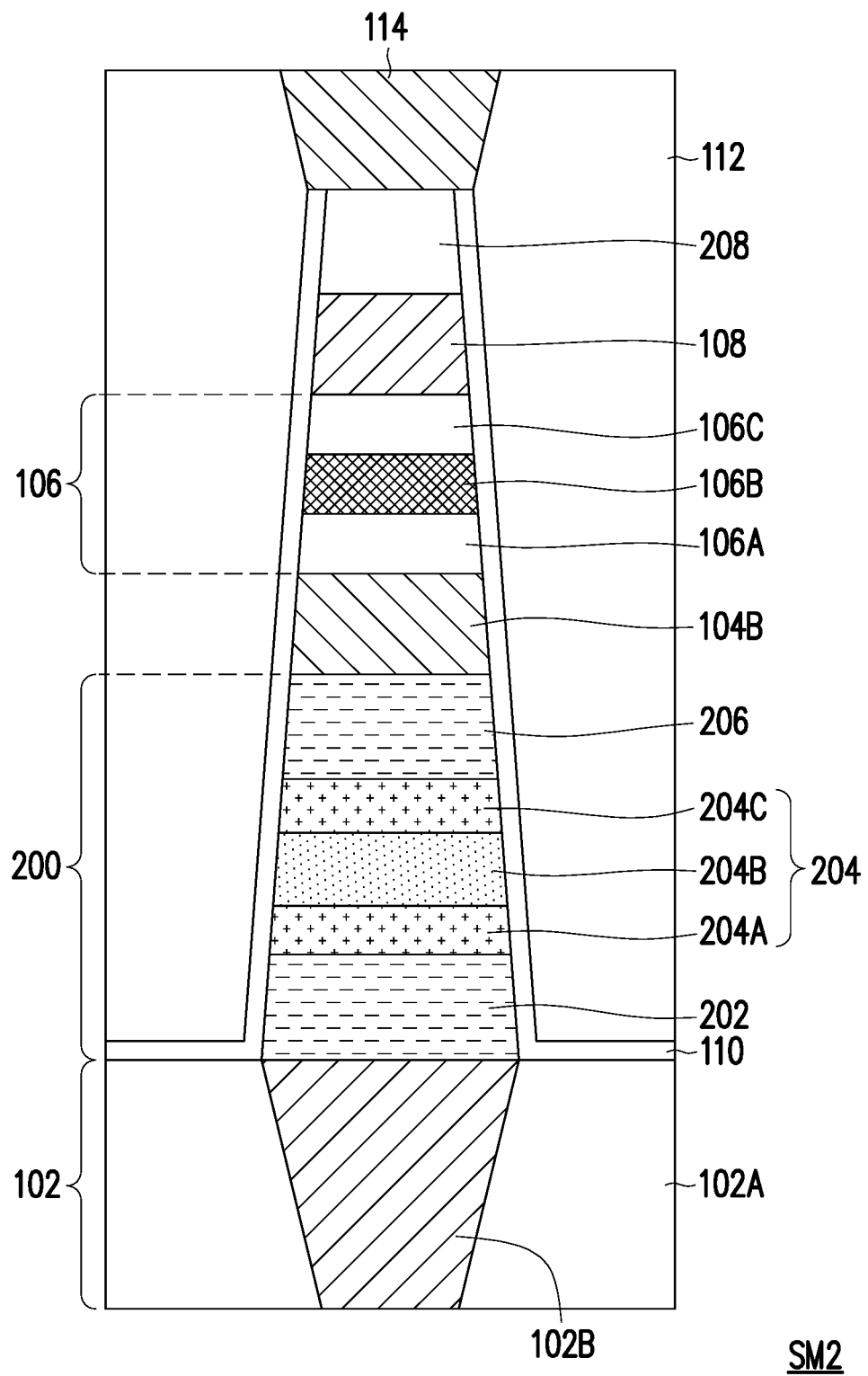

Referring to FIG. 2C, after performing the selective etching process, a liner layer 110 is conformally formed over the first interconnection structure 102 and over the hard mask layer 208. Thereafter, a passivation layer 112 is formed on the liner layer 110 and over the first interconnection structure 102. In some embodiments, the passivation layer 112 is formed to surround the selector 200, the bottom electrode 104B, the storage element layer 106, the top electrode 108, and the hard mask layer 208. Referring to FIG. 2D, in a subsequent step, portions of the passivation layer 112 and portions of the liner layer 112 are removed to form an opening (not shown) revealing a surface of the hard mask layer 208 (metal hard mask). Thereafter, a second interconnection structure 114 is formed in the opening over the hard mask layer 208, and the second interconnection structure 114 is electrically and physically connected to the hard mask layer 208. After forming the second interconnection structure 114, a semiconductor device SM2 according to some embodiments of the present disclosure is accomplished.

As illustrated in FIG. 2D, the semiconductor device SM2 includes a storage element layer 106 and a selector 200 electrically coupled to the storage element layer 106. For example, the selector 200 is electrically connected to the storage element layer 106 through the bottom electrode 104B. In some embodiments, the first interconnection structure 102 is electrically connected to the first conductive layer 202 of the selector 200. In certain embodiments, the second interconnection structure 114 is electrically connected to the storage element layer 106 (the MTJ) through the hard mask layer 208 (metal hard mask) and the top electrode 108. In the semiconductor device SM2, by using the selector 200 electrically coupled to the storage element layer 106 (the MTJ), a device that enables full control of leakage current, threshold voltage and maximum current density independently can be achieved.

FIG. 3A to FIG. 3F are schematic sectional views of various stages in a method of forming a semiconductor device in accordance with some other embodiments of the present disclosure. The method illustrated in FIG. 3A to FIG. 3F is similar to the method illustrated in FIG. 2A to FIG. 2D. Therefore, the same reference numerals are used to refer to the same or liked parts, and its detailed description will be omitted herein.

Figure 3A:
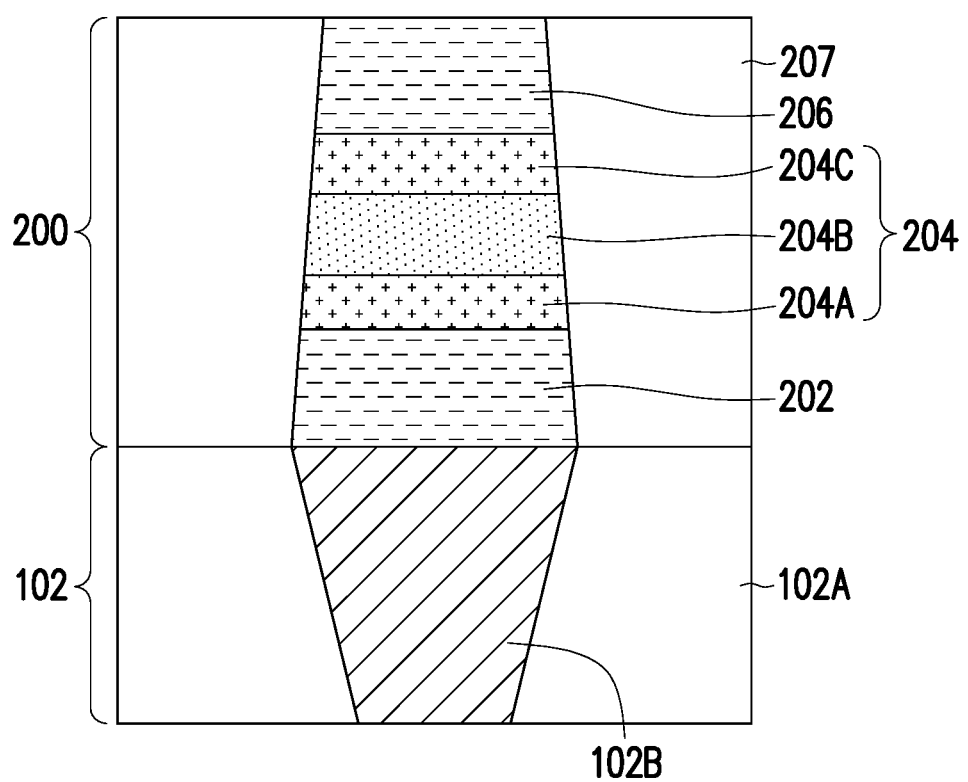
FIG. 3A to FIG. 3F are schematic sectional views of various stages in a method of forming a semiconductor device in accordance with some other embodiments of the present disclosure.

Referring to FIG. 3A, a first interconnection structure 102 is provided. The first interconnection structure 102 may include an insulating layer 102A and a conductive via 102B disposed therein. After providing the first interconnection structure 102, a selector 200 is formed over the conductive via 102B of first interconnection structure 102. For example, in one embodiment, the selector 200 is formed by sequentially depositing a first conductive layer 202, insulating layers 204 (a first insulating layer 204A, a second insulating layer 204B and a third insulating layer 204C) and a second conductive layer 206 stacked up in sequence. Thereafter, the first conductive layer 202, the insulating layers 204 and the second conductive layer 206 are selectively etched to form the selector 200 having inclined sidewalls. In some embodiments, a passivation layer 207 is formed on the first interconnection structure 102 to surround the selector 200. In certain embodiments, a planarization process (e.g. a chemical-mechanical planarization (CMP) process) is performed on the passivation layer 207 so that a top surface of the passivation layer 207 is aligned with a top surface of the selector 200. The passivation layer 207 may be formed of the same method and be made of materials similar to that of the passivation layer 112 described in previous embodiments. Therefore, the details of the passivation layer 207 will be omitted herein.

Figure 3B:
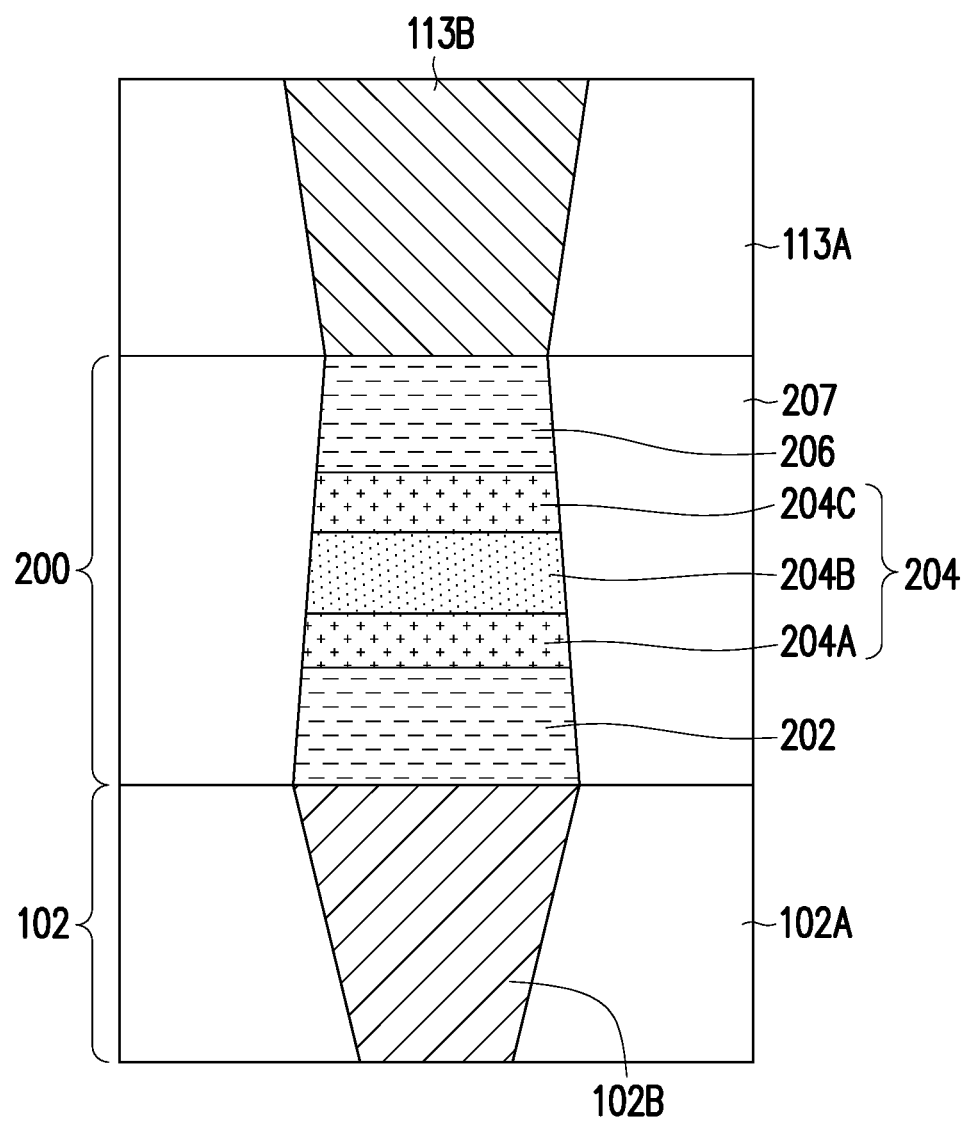

Referring to FIG. 3B, in a subsequent step, a connecting via 113B and an insulating layer 113A is formed over the selector 200 and the passivation layer 207. For example, the connecting via 113B is electrically and physically connected to the second conductive layer 206 of the selector 200, whereby the insulating layer 113A is surrounding the connecting via 113B. The insulating layer 113A may be formed by any suitable method, such as chemical vapor deposition (CVD), or the like. The connecting via 113B may be formed by patterning the insulting layer 113A to form openings; filling the openings with conductive materials; and performing a planarization step (e.g. chemical-mechanical planarization; CMP) to form the connecting via 113B having a top surface that is levelled with a top surface of the insulating layer 113A.

Figure 3C:
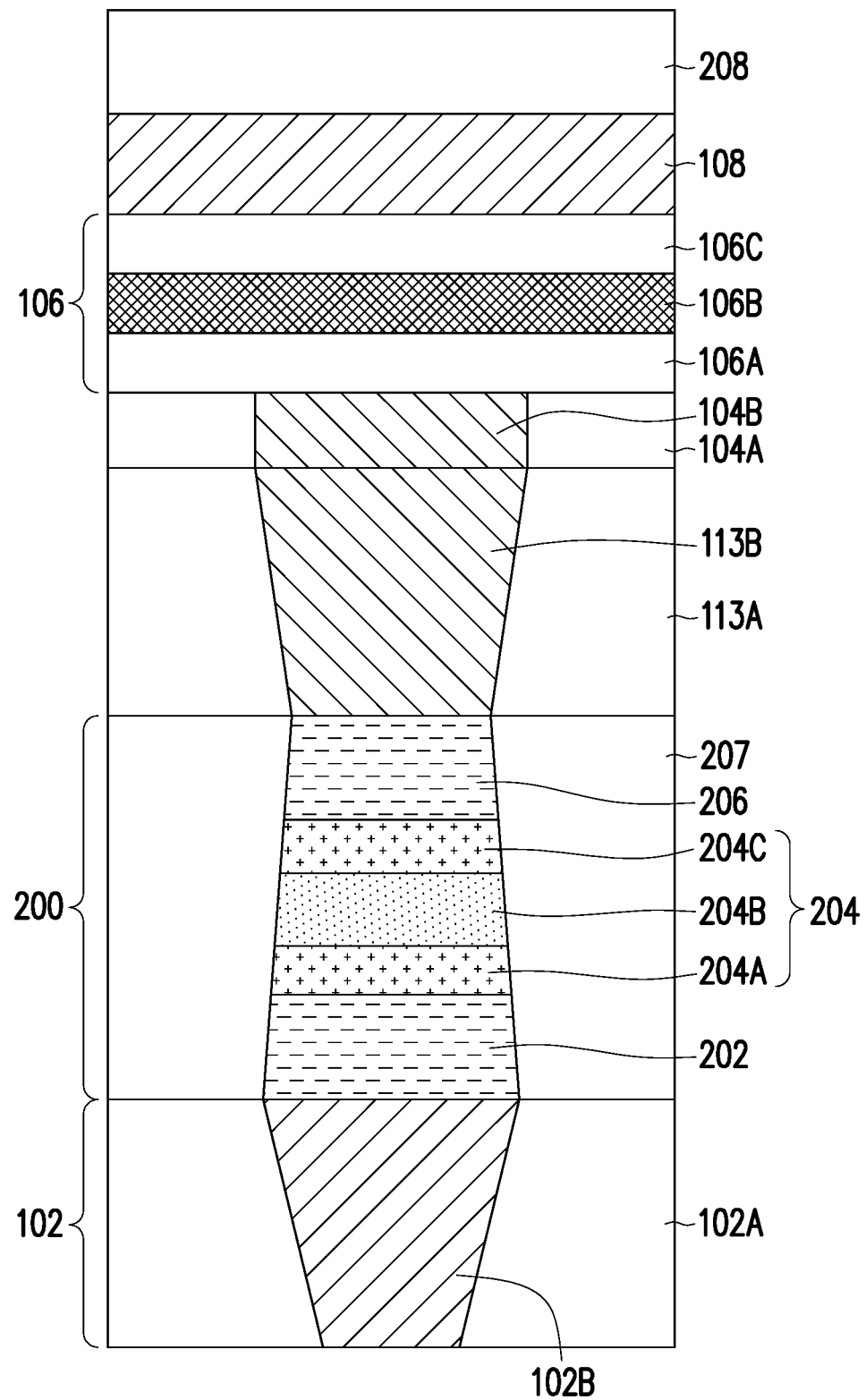

Referring to FIG. 3C, after forming the connecting via 113B and the insulating layer 113A, an insulating layer 104A and a bottom electrode 104B embedded in the insulating layer 104A are formed over the connecting via 113B. For example, the bottom electrode 104B is electrically and physically connected to the connecting via 113B. Subsequently, a storage element layer 106 (the MTJ) inclusive of a reference layer 106A, a tunnel barrier layer 106B and a free layer 106C is formed over the bottom electrode 104B. Thereafter, a top electrode 108 and a hard mask layer 208 are sequentially formed over the storage element layer 106 (the MTJ).

Figure 3D:
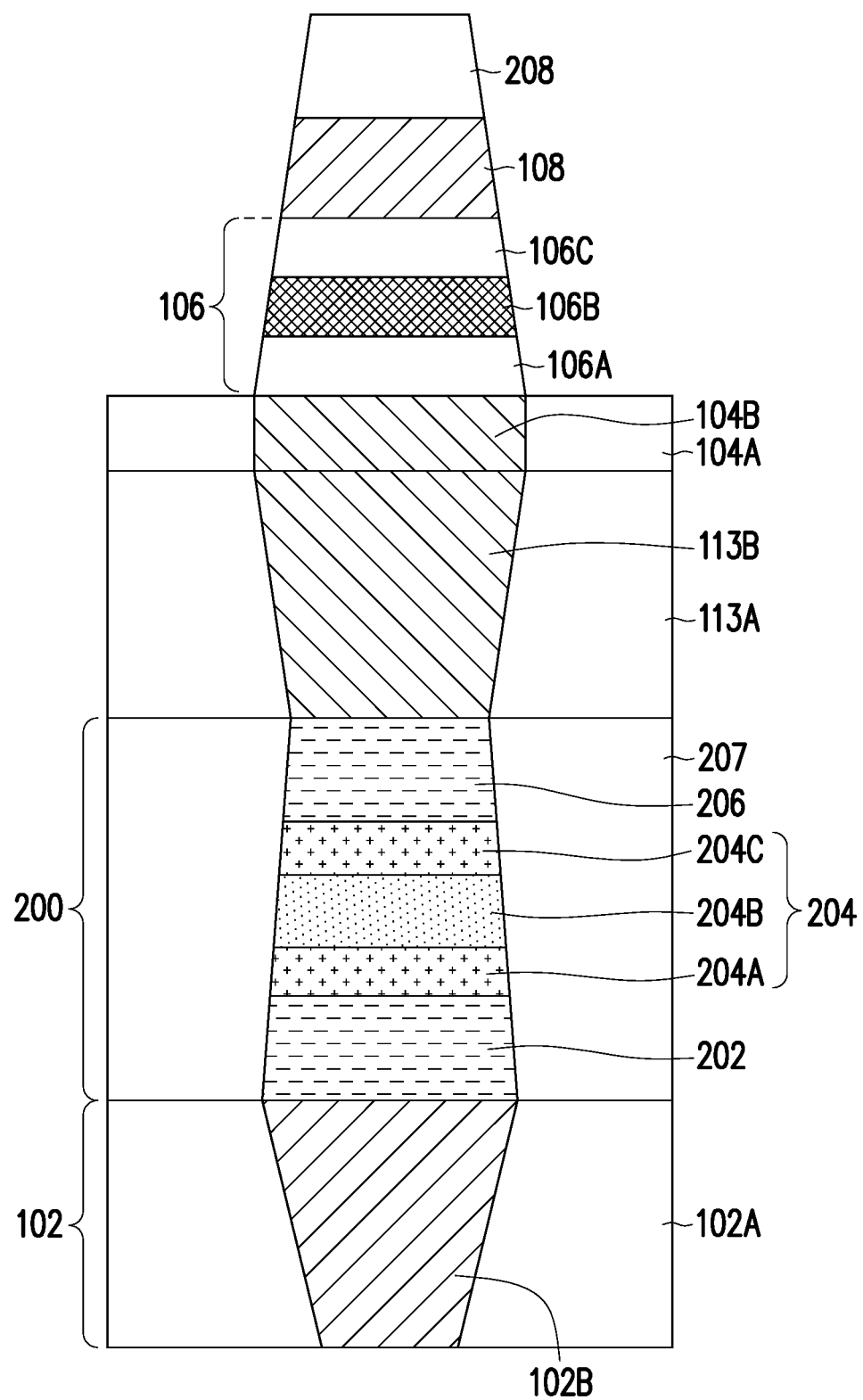
Figure 3E:
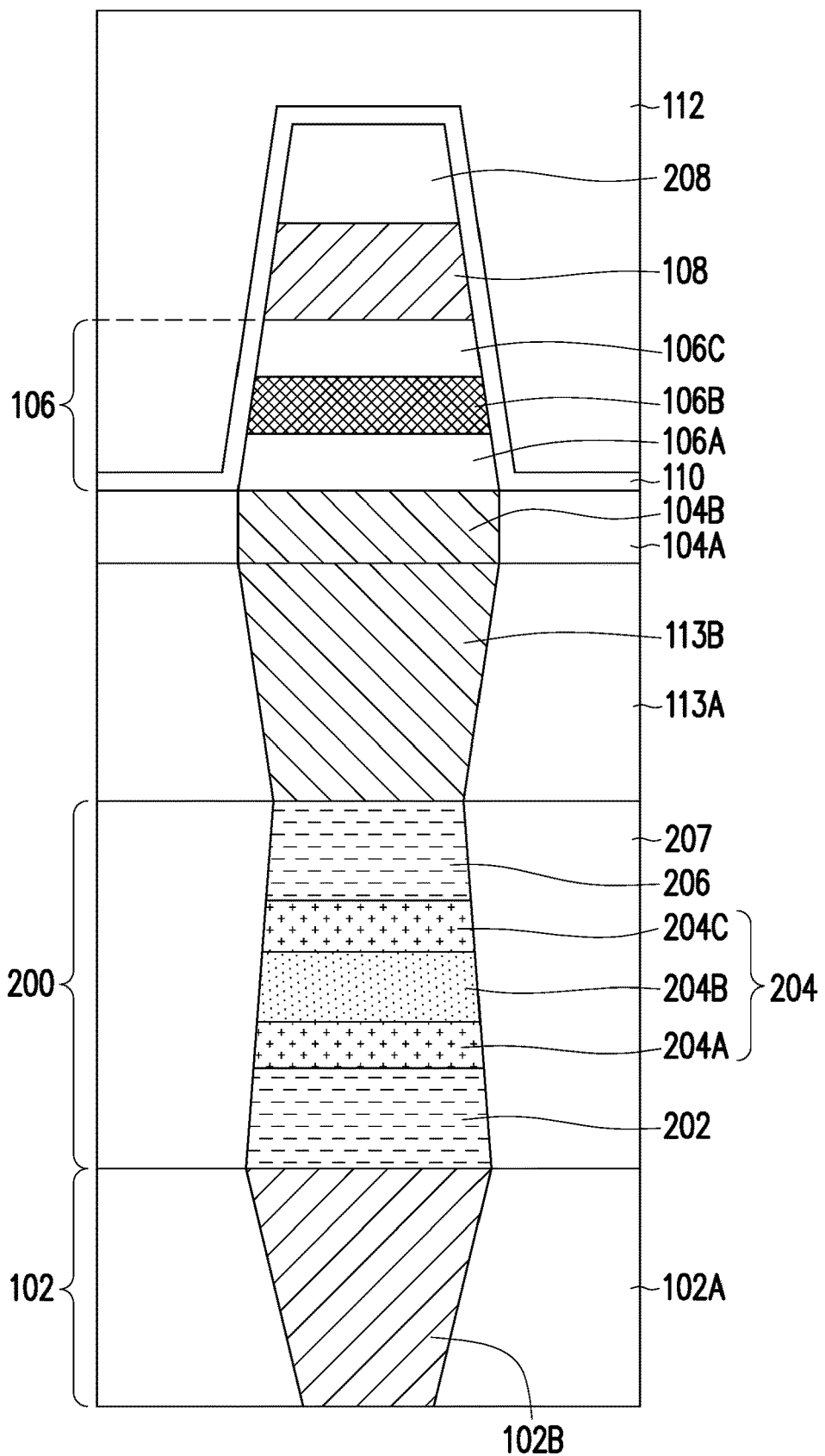

Referring to FIG. 3D, in some embodiments, the storage element layer 106, the top electrode 108, and the hard mask layer 208 are selectively etched to form a stacked structure having inclined sidewalls. For example, the selective etching process includes a reactive ion etching (RIE) process, an ion beam etching (IBE) process, or combinations thereof. Referring to FIG. 3E, after performing the selective etching process, a liner layer 110 is conformally formed over the insulating layer 104A and over the hard mask layer 208. Thereafter, a passivation layer 112 is formed on the liner layer 110 and over the insulating layer 104A. In some embodiments, the passivation layer 112 is formed to surround the storage element layer 106 (the MTJ), the top electrode 108 and the hard mask layer 208.

Figure 3F:
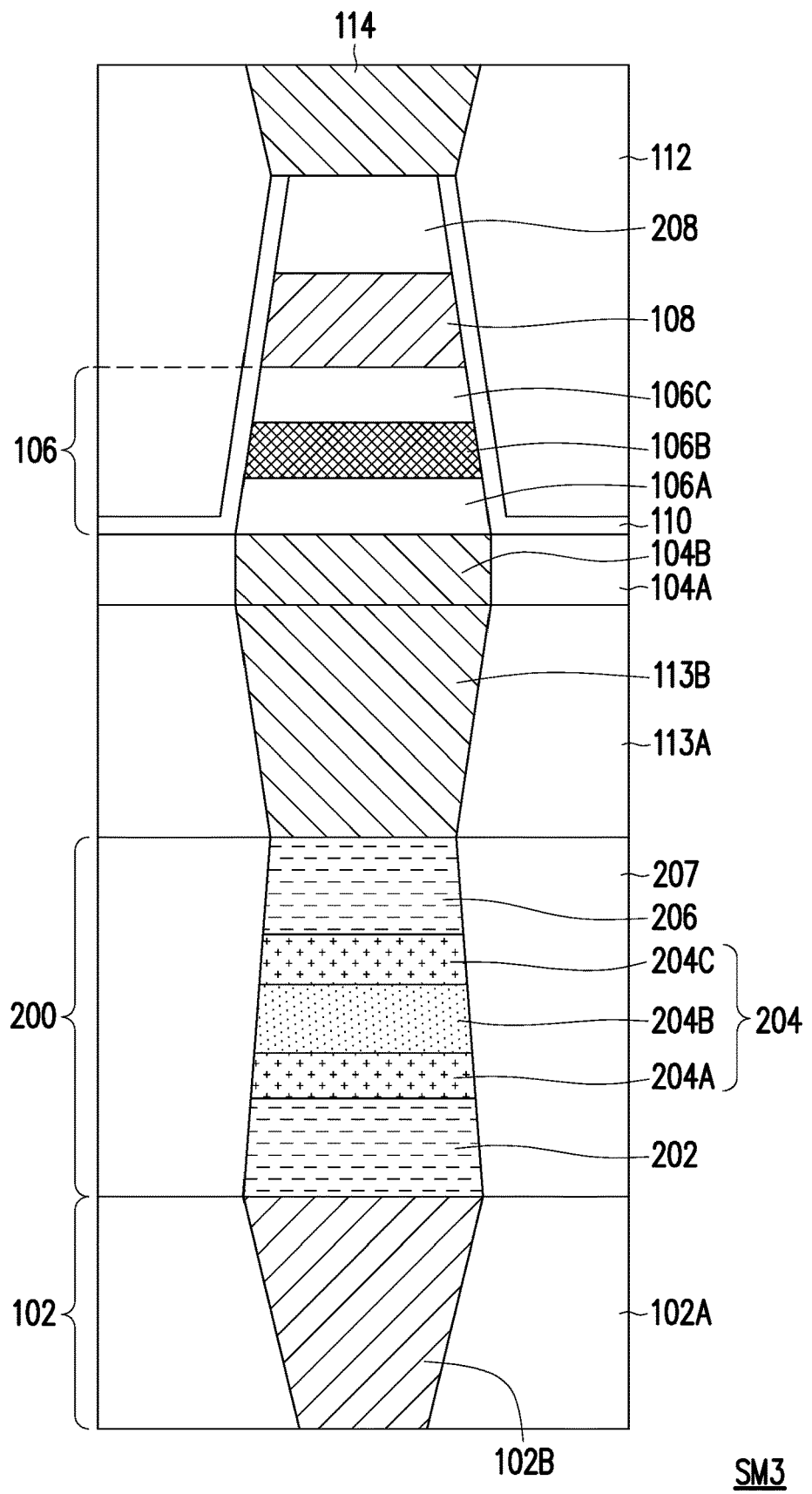

Referring to FIG. 3F, in a subsequent step, portions of the passivation layer 112 and portions of the liner layer 112 are removed to form an opening (not shown) revealing a surface of the hard mask layer 208 (metal hard mask). Thereafter, a second interconnection structure 114 is formed in the opening over the hard mask layer 208, and the second interconnection structure 114 is electrically and physically connected to the hard mask layer 208. After forming the second interconnection structure 114, a semiconductor device SM3 according to some embodiments of the present disclosure is accomplished.

As illustrated in FIG. 3F, the semiconductor device SM3 includes a storage element layer 106 and a selector 200 electrically coupled to the storage element layer 106. For example, the selector 200 is electrically connected to the storage element layer 106 through the bottom electrode 104B and the connecting vias 113B. In some embodiments, the first interconnection structure 102 is electrically connected to the first conductive layer 202 of the selector 200. In certain embodiments, the second interconnection structure 114 is electrically connected to the storage element layer 106 (the MTJ) through the hard mask layer 208 (metal hard mask) and the top electrode 108. In the semiconductor device SM3, by using the selector 200 electrically coupled to the storage element layer 106 (the MTJ), a device that enables full control of leakage current, threshold voltage and maximum current density independently can be achieved.

In the above-mentioned embodiments, the storage element layer 106 and the selector 200 may be disposed on top or below one another. In other words, the storage element layer 106 and the selector 200 are disposed along the same axis, and is overlapped with one another. Furthermore, the storage element layer 106 and the selector 200 may be connected to one another through electrodes (top or bottom electrodes 108 or 104B), and optionally though connecting vias 113B. However, the disclosure is not limited thereto. In some alternative embodiments, the storage element layer 106 and the selector 200 may be disposed on different axis, and are non-overlapped with one another. Such embodiment is described with reference to FIG. 4A to FIG. 4E.

FIG. 4A to FIG. 4E are schematic sectional views of various stages in a method of forming a semiconductor device in accordance with some other embodiments of the present disclosure. The method illustrated in FIG. 4A to FIG. 4E is similar to the method illustrated in FIG. 1A to FIG. 1E. Therefore, the same reference numerals are used to refer to the same or liked parts, and its detailed description will be omitted herein.

Figure 4A:
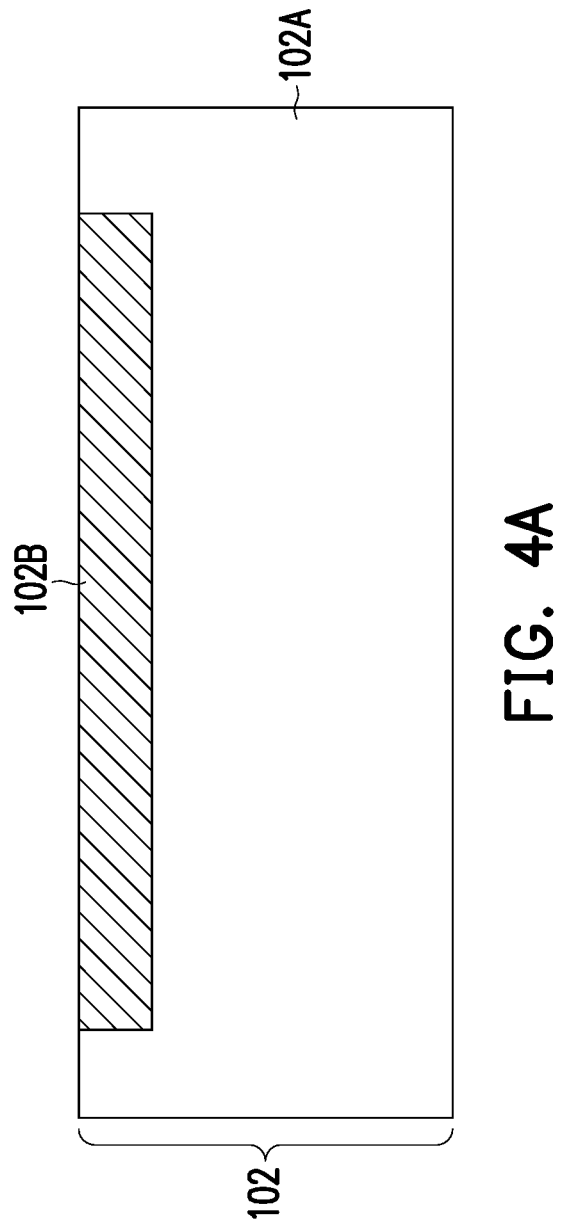
FIG. 4A to FIG. 4E are schematic sectional views of various stages in a method of forming a semiconductor device in accordance with some other embodiments of the present disclosure.

Referring to FIG. 4A, a first interconnection structure 102 is provided. The first interconnection structure 102 may include an insulating layer 102A and a conductive pad 102B disposed therein. The insulating layer 102A may be formed by any suitable method, such as chemical vapor deposition (CVD), or the like. The conductive pad 102B may be formed by patterning the insulting layer 102A to form openings; filling the openings with conductive materials; and performing a planarization step (e.g. chemical-mechanical planarization; CMP) to form the conductive pad 102B having a top surface that is levelled with a top surface of the insulating layer 102A.

Figure 4B:
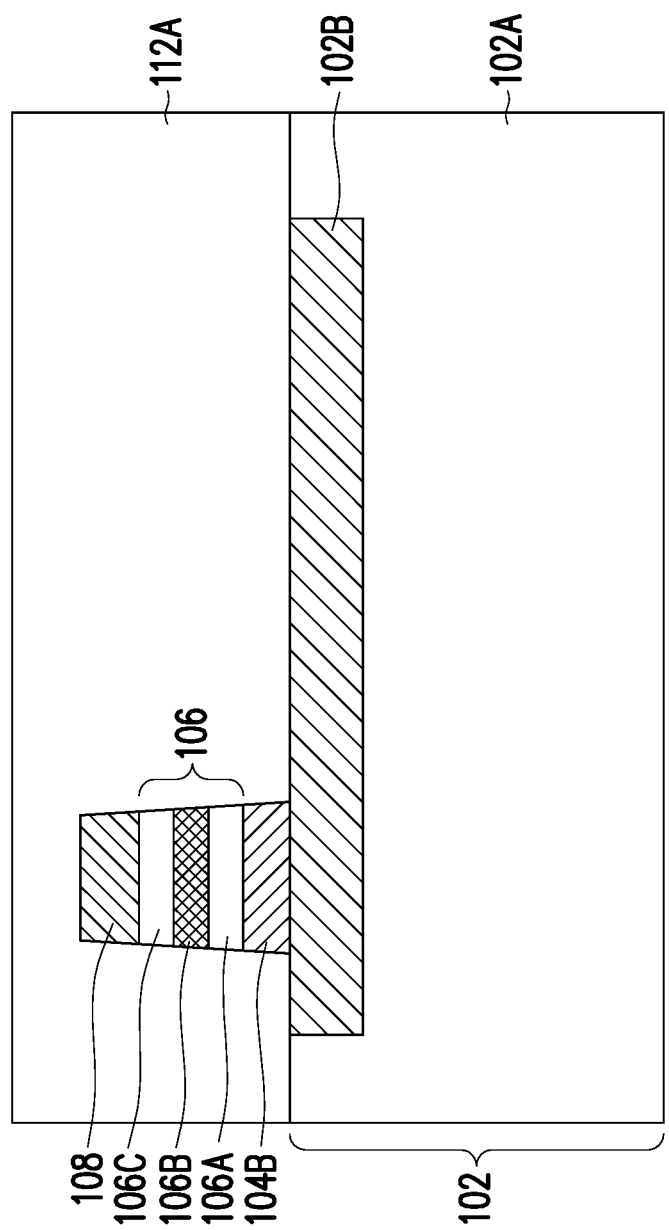

Referring to FIG. 4B, a bottom electrode 104B, a storage element layer 106 and a top electrode 108 are sequentially formed over the conductive pad 102B of the first interconnection structure 102. For example, the bottom electrode 104B is disposed on the conductive pad 102B, and is electrically and physically connected to the conductive pad 102B. The storage element layer 106 (the MTJ) inclusive of a reference layer 106A, a tunnel barrier layer 106B and a free layer 106C is formed over the bottom electrode 104B. Furthermore, a top electrode 108 is formed over the storage element layer 106, whereby the top electrode 108 is connected to the free layer 106C of the storage element layer 106. Thereafter, the bottom electrode 104B, the storage element layer 106 and the top electrode 108 are selectively etched to form a stacked structure having inclined sidewalls. In a subsequent step, a passivation layer 112A is formed over the first interconnection structure 102 to surround and cover the bottom electrode 104B, the storage element layer 106 and the top electrode 108. The passivation layer 112A may be formed by the same method and be made of materials similar to that of the passivation layer 112 described in previous embodiments. Therefore, the details of the passivation layer 112A will be omitted herein.

Figure 4C:
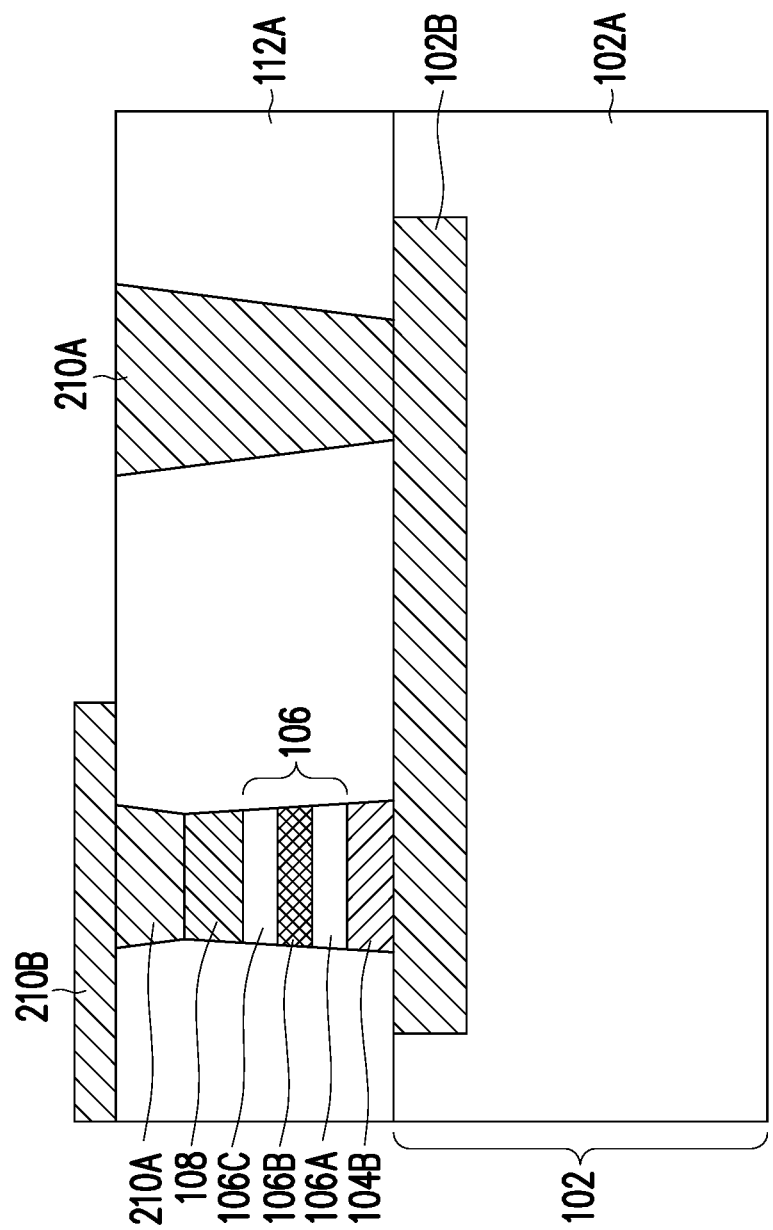

Referring to FIG. 4C, after forming the passivation layer 112A, the passivation layer 112A is etched to form an opening (not shown) revealing a top surface of the conductive pad 102B, and etched to form another opening (not shown) revealing a top surface of the top electrode 108. The openings are then filled with conductive materials to form connecting vias 210A located in the openings. Thereafter, a planarization step (e.g. chemical-mechanical planarization; CMP) may be performed so that the connecting vias 210A have top surfaces that are leveled with a top surface of the passivation layer 112A. In the exemplary embodiment, one of the connecting via 210A (first connecting via) is disposed on the first interconnection structure 102 aside the storage element layer 106 (the MTJ), while being electrically and physically connected to the conductive pad 102B. Furthermore, another one of the connecting via 210A (second connecting via) is disposed on the storage element layer 106, and being electrically and physically connected to the top electrode 108. After forming the connecting vias 210A, a conductive line 210B may be formed over the connecting via 210A (second connecting via) and over the passivation layer 112A. For example, the conductive line 210B is electrically connected to one of the connecting via 210A (second connecting via). In the exemplary embodiment, the conductive vias 210 and the conductive line 210B include metals or metal alloys such as one or more of Al, AlCu, Cu, Ti, TiN, W, or the like, and may be formed by electroplating, deposition or the like.

Figure 4D:
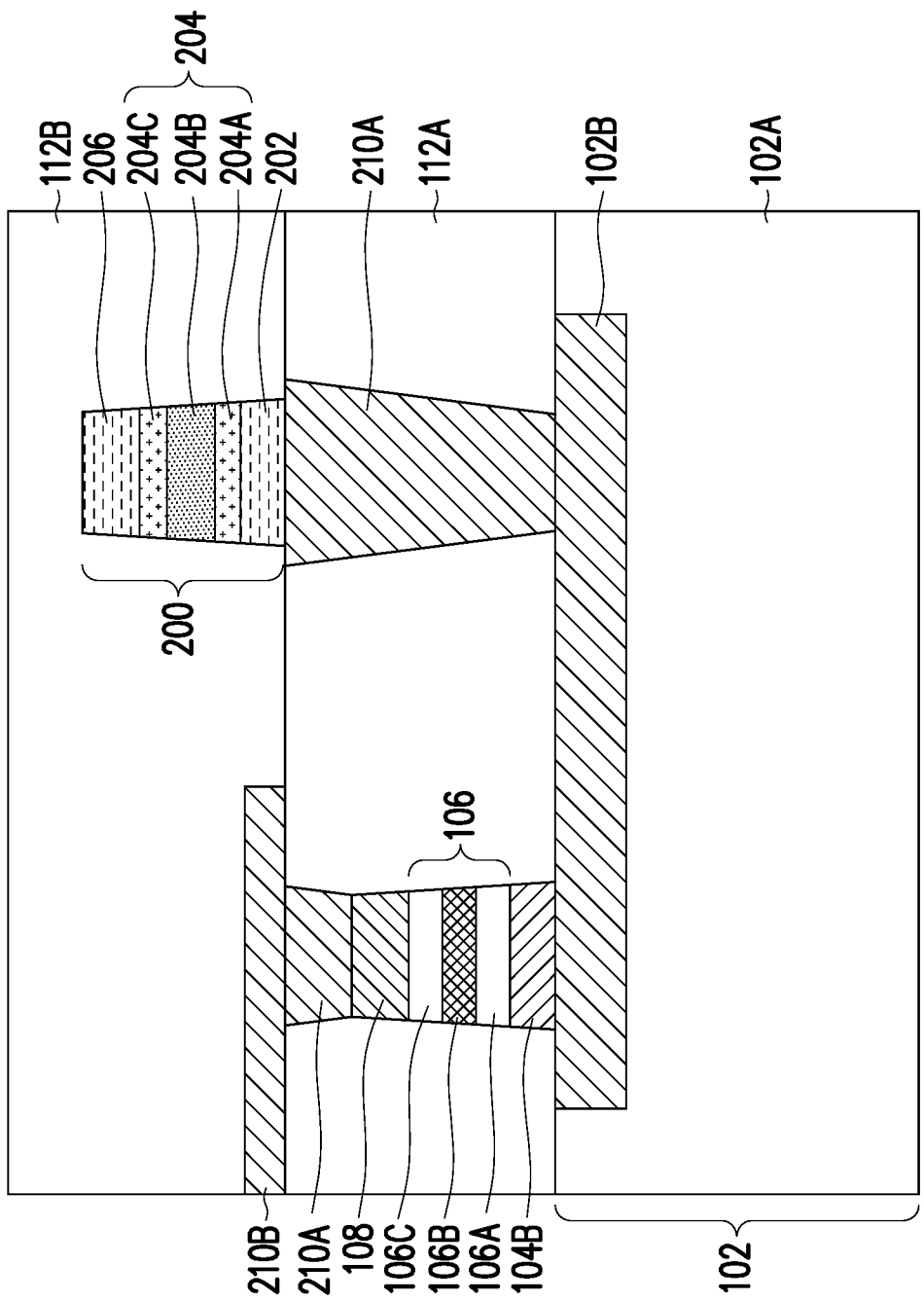

Referring to FIG. 4D, in a next step, a selector 200 is formed over the connecting via 210A (first connecting via). For example, in one embodiment, the selector 200 is formed by sequentially depositing a first conductive layer 202, insulating layers 204 (a first insulating layer 204A, a second insulating layer 204B and a third insulating layer 204C) and a second conductive layer 206 stacked up in sequence. Thereafter, the first conductive layer 202, the insulating layers 204 and the second conductive layer 206 are selectively etched to form the selector 200 having inclined sidewalls. In some embodiments, the connecting via 210A (first connecting via) is electrically and physically connecting the selector 200 to the first interconnection structure 102. Furthermore, the selector 200 is electrically coupled to the storage element layer 106 through the connecting via 210A (first connecting via), the conductive pad 102B and the bottom electrode 104B. In a subsequent step, a passivation layer 112B is formed over the passivation layer 112A to surround and cover the selector 200. The passivation layer 112B may be formed by the same method and be made of materials similar to that of the passivation layer 112 described in previous embodiments. Therefore, the details of the passivation layer 112B will be omitted herein.

Figure 4E:
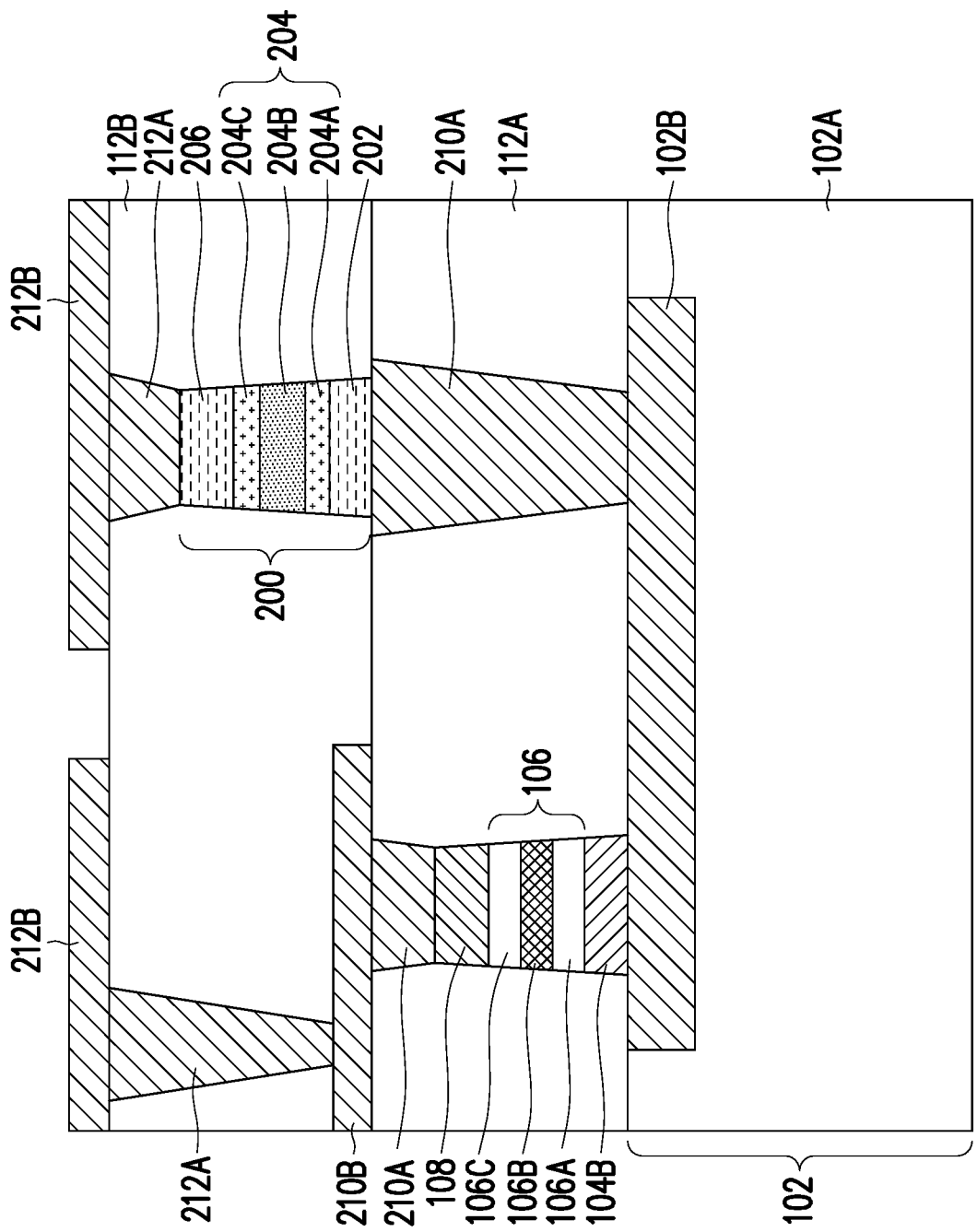

Referring to FIG. 4E, after forming the passivation layer 112B, the passivation layer 112B is etched to from an opening (not shown) revealing a top surface of the conductive line 210B, and etched to form another opening (not shown) revealing a top surface of the second conductive layer 206. The openings are then filled with conductive materials to form connecting vias 212A located in the openings. Thereafter, a planarization step (e.g. chemical-mechanical planarization; CMP) may be performed so that the connecting vias 212A have top surfaces that are leveled with a top surface of the passivation layer 112B. In the exemplary embodiment, one of the connecting via 212A (first connecting via) is disposed on the conductive line 210B aside the selector 200, while being electrically and physically connected to the conductive line 210B. Furthermore, another one of the connecting via 212A (second connecting via) is disposed on the selector 200, and being electrically and physically connected to the second conductive layer 206 of the selector 200. After forming the connecting vias 212A, conductive lines 212B may be formed over the connecting vias 212A and over the passivation layer 112B. For example, the connecting vias 212A and conductive lines 212B may constitute a second interconnection layer of the device. After forming the conductive lines 212B, a semiconductor device SM4 according to some embodiments of the present disclosure is accomplished.

As illustrated in FIG. 4E, the semiconductor device SM4 includes a storage element layer 106 and a selector 200 electrically coupled to the storage element layer 106. For example, the selector 200 is electrically connected to the storage element layer 106 through the connecting via 210A (first connecting via), the conductive pad 102B and the bottom electrode 104B. In some embodiments, the first interconnection structure 102 is electrically and physically connected to the storage element layer 106 (the MTJ) through the bottom electrode 104B. In certain embodiments, the second interconnection structure (212A, 212B) is electrically and physically connected to the second conductive layer 206 of the selector 200. Furthermore, the storage element layer 106 and the selector 200 are disposed on different axis over the first interconnection structure 102, and are non-overlapped with one another. In the semiconductor device SM4, by using the selector 200 electrically coupled to the storage element layer 106 (the MTJ), a device that enables full control of leakage current, threshold voltage and maximum current density independently can be achieved.

In the above-mentioned embodiments, the semiconductor devices (SM1-SM4) are shown to include a first interconnection structure 102 for providing interconnection. Although the first interconnection structure 102 is illustrated to include a single layer of conductive via and/or conductive pad embedded within an insulating layer, however, the disclosure is not limited thereto. The first interconnection structures 102 will be described in more detail with reference to FIG. 5.

Figure 5:
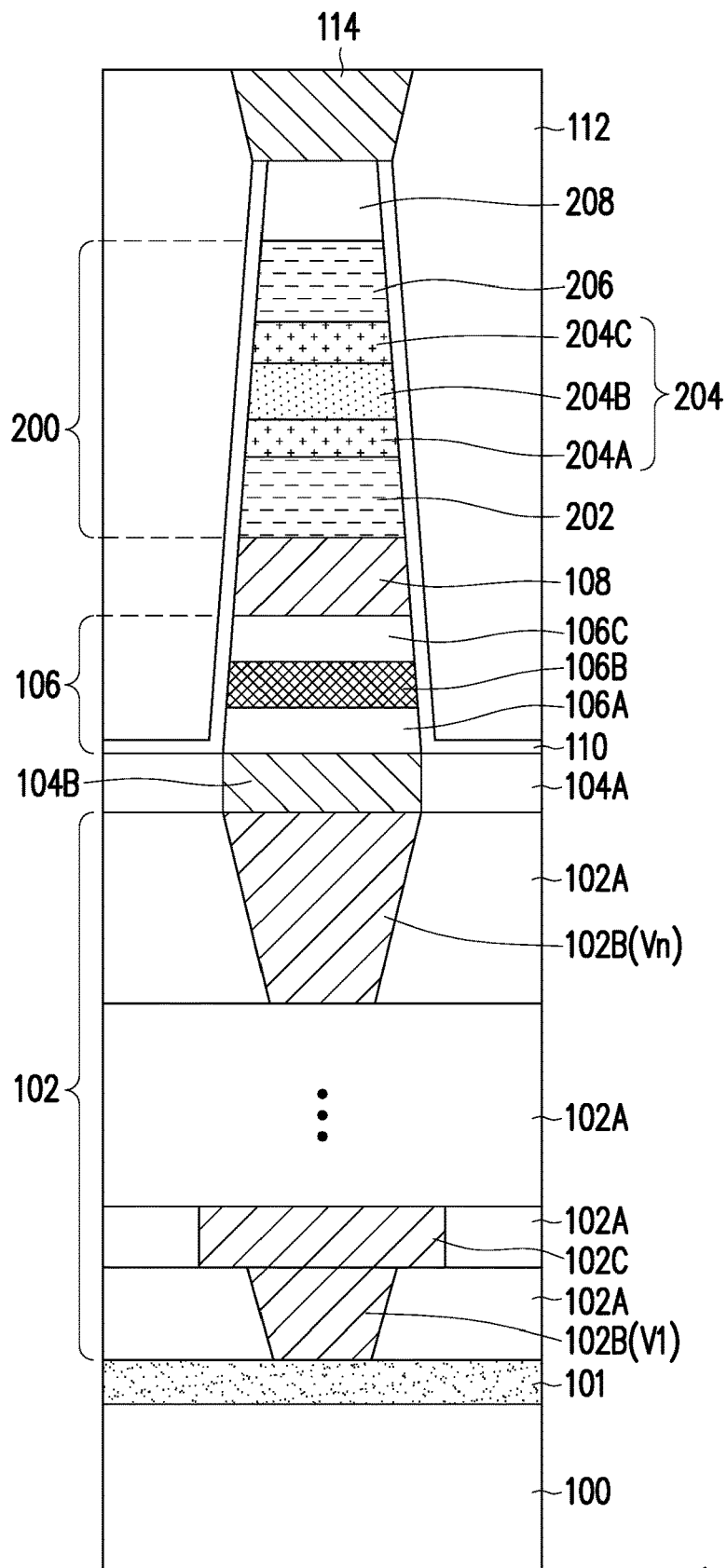
FIG. 5 is a schematic sectional view of a semiconductor device in accordance with some embodiments of the present disclosure.

FIG. 5 is a schematic sectional view of a semiconductor device in accordance with some embodiments of the present disclosure. The semiconductor device SM1' illustrated in FIG. 5 is similar to the semiconductive device SM1 illustrated in FIG. 1E. Therefore, the same reference numerals are used to refer to the same or liked parts, and its detailed description is omitted herein.

Referring to FIG. 5, the semiconductor device SM1' may include a substrate 100, a device region 101, a first interconnection structure 102, a bottom electrode 104B, a storage element layer 106, a top electrode 108, a selector 200, a hard mask layer 208 and a second interconnection structure 114. In some embodiments, the substrate 100 is a semiconductor substrate, such as a bulk semiconductor, a semiconductor-on-insulator (SOI) substrate, or the like. The substrate 100 may be doped (e.g., with a p-type or an n-type dopant) or undoped. The substrate 100 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 101 is disposed on the substrate 100 in a front-end-of-line (FEOL) process. The device region 101 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 101 includes a gate structure, source and drain regions, and isolation structures such as shallow trench isolation (STI) structures (not shown). In the device region 101, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 100. The functions of the devices may include memory, processors, sensors, amplifiers, power distribution, input/output circuitry, or the like.

As illustrated in FIG. 12, the first interconnection structure 102 is disposed on the device region 101, and the device region 101 is disposed between the substrate 100 and the first interconnect structure 102. In some embodiments, the first interconnect structure 102 includes a plurality of insulating layer 102A, a plurality of conductive vias 102B and a plurality of conductive pads 102C alternately stacked. The insulating layers 102A are referred to as an inter-metal dielectric (IMD) layer which may be made of a dielectric material, such as silicon oxide, silicon nitride, silicon oxynitride, a spin-on dielectric material, or a low-k dielectric material. The conductive vias 102B and the conductive pads 102C include commonly used conductive materials, such as metals or metal alloys including one or more of Al, AlCu, Cu, Ti, TiN, W, and the like. In some embodiments, the conductive via 102B connected to the device region 101 may be referred as "via 1" (V1), and the conductive via 102B connected to the bottom electrode 104B is referred as "via n" (Vn). There may be a plurality of conductive vias 102B and conductive pads 102C disposed in between the V1 and Vn conductive vias 102B, and this may be adjusted based on design requirement.

After forming the first interconnection structure 102, the same method described in FIG. 1B to FIG. 1E may be performed to form the bottom electrode 104B, the storage element layer 106, the top electrode 108, the selector 200, the hard mask layer 208 and the second interconnection structure 114 over the first interconnection structure 102. For example, the storage element layer 106 and the selector 200 are disposed between the first interconnection structure 102 and the second interconnection structure 114 in the back-end-of-line (BEOL) process. After forming the second interconnection structure 114, a semiconductor device SM1' according to some embodiments of the present disclosure is accomplished.

As illustrated in FIG. 5, the semiconductor device SM1' includes a storage element layer 106 and a selector 200 electrically coupled to the storage element layer 106. For example, the selector 200 is electrically connected to the storage element layer 106 through the top electrode 108. In some embodiments, the first interconnection structure 102 is electrically connected to the storage element layer 106 (the MTJ) through the bottom electrode 104B. In certain embodiments, the second interconnection structure 114 is electrically connected to the selector 200 through the hard mask layer 208 (metal hard mask). In the semiconductor device SM1', by using the selector 200 electrically coupled (in series) to the storage element layer 106 (the MTJ), a device that enables full control of leakage current, threshold voltage and maximum current density independently can be achieved.

In the above-mentioned embodiments, the semiconductor device includes a storage element layer and a selector electrically coupled to the storage element layer. The selector includes first and second conductive layers having the selected work function, and includes insulating layers respectively made of low and high band gap materials. As such, better control of the on/off current of the selector may be achieved, and the selector enables full control of the leakage current as the current passing through a selected cell exceeds the residual leakage. By using such a selector that is electrically coupled to the storage element layer, a semiconductor device that enables full control of leakage current, threshold voltage and maximum current density independently can be achieved.

In accordance with some embodiments of the present disclosure, a semiconductor device includes a storage element layer and a selector. The selector is electrically coupled to the storage element layer, and includes a first insulating layer, a second insulating layer and a third insulating layer, a first conductive layer and a second conductive layer. The first insulating layer, the second insulating layer and the third insulating layer are stacked up in sequence, wherein the second insulating layer is sandwiched in between the first insulating layer and the third insulating layer, and the first insulating layer and the third insulating layer include materials with higher band gap as compared with a material of the second insulating layer. The first conductive layer is connected to the first insulting layer, and the second conductive layer is connected to the third insulating layer.

In accordance with some other embodiments of the present disclosure, a semiconductor device includes a first interconnection structure, a magnetic tunnel junction, a selector and a second interconnection structure. The first interconnection structure is disposed on a substrate. The magnetic tunnel junction and the selector are disposed on the first interconnection structure, wherein the magnetic tunnel junction is electrically coupled to the selector. The selector includes a first conductive layer, a second conductive layer, two high band gap material layers and a low band gap material layer. The first conductive layer is electrically connected to the first interconnection structure. The second conductive layer is disposed over the first conductive layer and electrically connected to the first interconnection structure. The two high band gap material layers are disposed in between the first conductive layer and the second conductive layer. The low band gap material layer is disposed in between the two high band gap material layers, wherein a ratio of a thickness of each of the two high band gap material layers relative to a thickness of the low band gap material layer is 1:1 to 1:50. The second interconnection structure is disposed over the magnetic tunnel junction and the selector, and electrically connected to the magnetic tunnel junction and the selector.

In accordance with yet another embodiment of the present disclosure, a method of forming a semiconductor device is described. The method includes the following steps. A storage element layer and a selector are formed over a first interconnection structure, wherein the storage element layer is electrically coupled to the selector. A method of forming the selector includes the following steps. A first conductive layer is formed over the first interconnection structure. A first insulating layer, a second insulating layer and a third insulating layer are sequentially formed and stacked over the first conductive layer, wherein the first insulating layer and the third insulating layer include materials with higher band gap as compared with a material of the second insulating layer. The second conductive layer is formed over the third insulating layer. A second interconnection structure is formed over the storage element layer and the selector The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a bottom electrode having linear sidewalls;
   a storage element layer disposed on and in physical contact with the bottom electrode;
   a top electrode disposed on and in physical contact with the storage element layer;
   a selector disposed on and in physical contact with the top electrode, wherein the selector comprises a first conductive layer, a second conductive layer and a plurality of insulating layers disposed in between the first conductive layer and the second conductive layer; and
   a metal hard mask layer disposed on the selector and the storage element layer, wherein the metal hard mask layer has slanted sidewalls, and the slanted sidewalls of the metal hard mask layer are aligned with slanted sidewalls of the selector, aligned with slanted sidewalls of the top electrode, and aligned with slanted sidewalls of the storage element layer; and
   a dielectric layer covering the linear sidewalls of the bottom electrode;
   a passivation layer covering the slanted sidewalls of the metal hard mask layer, the slanted sidewalls of the top electrode and the slanted sidewalls of the storage element layer, wherein the passivation layer is physically separated from the dielectric layer; and
   an interconnection structure disposed on the metal hard mask layer, wherein the interconnection structure is electrically connected to a surface of the metal hard mask layer, and a maximum width of the interconnection structure is greater than a maximum width of the metal hard mask layer.

2. The structure according to claim 1, further comprising a liner layer covering the slanted sidewalls of the metal hard mask layer, the slanted sidewalls of the selector and the slanted sidewalls of the storage element layer, wherein the liner layer is physically separating the dielectric layer from the passivation layer.

3. The structure according to claim 1, wherein the plurality of insulating layers of the selector includes a first insulating layer, a second insulating layer and a third insulating layer, the first insulating layer is in contact with the first conductive layer, the third insulating layer is in contact with the second conductive layer, the second insulating layer is sandwiched in between the first conductive layer and the third insulating layer, and wherein the first insulating layer and the third insulating layer include materials with higher band gap as compared with a material of the second insulating layer.

4. The structure according to claim 3, wherein the first insulating layer and the third insulating layer include materials selected from the group consisting of silicon nitride (SiN), silicon oxide ($SiO_2$), aluminum oxide ($Al_2O_3$), yttrium oxide ($Y_2O_3$) and hafnium silicate ($HfSiO_x$).

5. The structure according to claim 3, wherein the second insulating layer includes a material selected from the group consisting of titanium oxide ($TiO_2$), strontium titanate ($SrTiO_3$), barium titanate ($BaTiO_3$), zirconium oxide ($ZrO_2$), hafnium oxide ($HfO_2$) and hafnium titanate ($HfTiO_x$).

6. The structure according to claim 1, wherein the storage element layer comprises a reference layer, a free layer and a tunnel barrier layer located in between the reference layer and the free layer.

7. The structure according to claim 1, wherein sidewalls of the interconnection structure are misaligned with the slanted sidewalls of the metal hard mask layer, and wherein the passivation layer is covering and contacting the sidewalls of the interconnection structure.

8. The structure according to claim 1, further comprising a conductive via disposed directly below the bottom electrode and electrically connected to the bottom electrode.

9. The structure according to claim 2, wherein the liner layer is contacting a bottom surface of the interconnection structure.

10. A structure, comprising:
    a selector disposed on a first interconnection structure, wherein the selector comprises:
    a first conductive layer electrically connected to the first interconnection structure;
    a second conductive layer disposed over the first conductive layer and electrically connected to the first interconnection structure;
    two high band gap material layers disposed in between the first conductive layer and the second conductive layer; and
    a low band gap material layer disposed in between the two high band gap material layers, wherein the low band gap material layer is strontium titanate ($SrTiO_3$), and wherein a thickness of each of the two high band gap material layers is smaller than a thickness of the low band gap material layer, and the thickness of the low band gap material layer is in a range of 1 nm to 5 nm, and the thickness of each of the two high band gap material layers is in a range of 0.1 nm to 1 nm; and
    a magnetic tunnel junction disposed on the first interconnection structure and electrically coupled to the selector.

11. The structure according to claim 10, wherein the selector has slanted sidewalls, and the slanted sidewalls of the selector are aligned with slanted sidewalls of the magnetic tunnel junction.

12. The structure according to claim 10, wherein the two high band gap material layers include materials selected from the group consisting of silicon nitride (SiN), silicon oxide ($SiO_2$), aluminum oxide ($Al_2O_3$), yttrium oxide ($Y_2O_3$) and hafnium silicate ($HfSiO_x$).

13. The structure according to claim 10, further comprising:
- a top electrode layer disposed on the magnetic tunnel junction;
- a bottom electrode layer disposed below the magnetic tunnel junction; and
- a liner structure covering sidewalls of the selector, sidewalls of the magnetic tunnel junction, sidewalls of the top electrode layer, and uncovering sidewalls of the bottom electrode layer.

14. The structure according to claim 13, wherein the magnetic tunnel junction comprises a reference layer, a tunnel barrier layer and a free layer sandwiched in between the top electrode layer and the bottom electrode layer.

15. The structure according to claim 10, further comprising:
- a metal hard mask layer disposed on the selector; and
- a second interconnection structure disposed on the metal hard mask layer, wherein sidewalls of the second interconnection layer are misaligned with sidewalls of the metal hard mask layer.

16. The structure according to claim 10, wherein a ratio of the thickness of each of the two high band gap material layers relative to the thickness of the low band gap material layer is 1:2 to 1:40.

17. A structure, comprising:
- a first interconnection structure comprising a conductive via, wherein a lateral dimension of the conductive via increases along a first direction; and
- a selector, a bottom electrode, a storage element layer a top electrode and a hard mask layer sequentially disposed and stacked up on the first interconnection structure along the first direction, wherein lateral dimensions of the selector, the bottom electrode, the storage element layer, the top electrode and the hard mask layer decreases along the first direction, and wherein the selector comprises a plurality of insulating layers sandwiched between two conductive layers; and
- a second interconnection structure disposed over the top electrode, wherein a lateral dimension of the second interconnection structure increases along the first direction, and wherein the second interconnection structure is contacting and electrically connected to the hard mask layer.

18. The structure according to claim 17, further comprising a passivation layer surrounding the selector, the bottom electrode, the storage element layer and the top electrode and the second interconnection layer.

19. The structure according to claim 17, further comprising a liner structure covering sidewalls of the selector, the bottom electrode, the storage element layer and the top electrode.

20. The structure according to claim 17, wherein the selector has slanted sidewalls, and wherein slanted sidewalls of the conductive via are joined to the slanted sidewalls of the selector, and slanted sidewalls of the second interconnection layer are misaligned with the slanted sidewalls of the selector and the slanted sidewalls of the conductive via.

* * * * *